United States Patent [19]

Tomizawa et al.

[11] Patent Number: 5,126,781

[45] Date of Patent: Jun. 30, 1992

[54] IMAGE RECORDING APPARATUS

[75] Inventors: Takashi Tomizawa, Aichi; Takakuni Sonoda; Kazunori Tanabe, both of Nagoya; Yumio Matsumoto, Kasugai; Yasuo Kimura, Ichinomiya; Shigeyuki Hayashi, Gifu; Yousuke Ito, Nagoya; Hiroshi Taira, Kasugai; Ichiro Sasaki, Nagoya; Osamu Takagi, Nagoya; Takatoshi Takemoto, Nagoya, all of Japan

[73] Assignee: Brother Kogyo Kabushiki Kaisha, Nagoya, Japan

[21] Appl. No.: 385,376

[22] Filed: Jul. 27, 1989

[30] Foreign Application Priority Data

| Jul. 29, 1988 | [JP] | Japan | 63-191944 |
| Jul. 29, 1988 | [JP] | Japan | 63-191945 |
| Sep. 28, 1988 | [JP] | Japan | 63-126960[U] |
| Oct. 3, 1988 | [JP] | Japan | 63-129752[U] |
| Oct. 17, 1988 | [JP] | Japan | 63-135386[U] |
| Oct. 24, 1988 | [JP] | Japan | 63-138351[U] |
| Oct. 27, 1988 | [JP] | Japan | 63-140359[U] |
| Oct. 31, 1988 | [JP] | Japan | 63-142141[U] |
| Oct. 31, 1988 | [JP] | Japan | 63-142142[U] |
| Oct. 31, 1988 | [JP] | Japan | 63-142153[U] |
| Dec. 21, 1988 | [JP] | Japan | 63-324434 |

[51] Int. Cl.$^5$ .................................. G03B 27/32
[52] U.S. Cl. .................................. 355/27; 355/30
[58] Field of Search ............... 355/27, 28, 30, 32, 355/285, 286, 287, 288; 219/216; 430/138

[56] References Cited

U.S. PATENT DOCUMENTS

| 3,440,944 | 4/1969 | Endermann et al. | 219/216 X |
| 3,583,805 | 6/1971 | Tanaka | 355/30 |
| 3,628,860 | 1/1969 | Ogawa | 219/216 |
| 4,549,803 | 10/1985 | Ohno et al. | 219/216 |
| 4,809,049 | 2/1989 | Okuzawa et al. | 355/28 |
| 4,893,147 | 1/1990 | Tanabe et al. | 355/27 |
| 4,942,423 | 7/1990 | Matsumoto et al. | 355/30 |
| 4,959,529 | 9/1990 | Matsumoto et al. | 219/216 X |
| 4,981,433 | 1/1991 | Matsumoto et al. | 355/30 |
| 4,994,642 | 2/1991 | Matsumoto et al. | 219/216. X |
| 5,023,654 | 6/1991 | Matsumoto et al. | 355/27 |
| 5,047,798 | 9/1991 | Yamamoto et al. | 355/27 |

FOREIGN PATENT DOCUMENTS

| 1256683 | 12/1971 | European Pat. Off. . |
| 240938 | 4/1988 | European Pat. Off. . |
| 263609 | 4/1988 | European Pat. Off. . |
| 329439 | 8/1989 | European Pat. Off. . |
| 350259 | 1/1990 | European Pat. Off. . |
| 2037562 | 12/1970 | France . |
| 2606171 | 10/1987 | France . |
| 2198253 | 6/1988 | United Kingdom . |

OTHER PUBLICATIONS

Research Disclosure Apr. 1987, p. 214.

Primary Examiner—L. T. Hix
Assistant Examiner—Khanh Dang
Attorney, Agent, or Firm—Oliff & Berridge

[57] ABSTRACT

An image recording apparatus having an exposure unit, a pressure developing unit and a thermal fixing unit. The apparatus employs a separate type image recording mediums including a microcapsule sheet and a separate developer sheet. The thermal fixing unit applies heat to the developer sheet carrying an output image thereon. A heat application means of the thermal fixing unit is positioned spaced away from the imaging surface of the developer sheet for avoding direct contact therewith.

24 Claims, 12 Drawing Sheets

IMAGE RECORDING APPARATUS

BACKGROUND OF THE INVENTION

The present invention relates to an image recording apparatus such as a copying machine or a printer, and more particularly, to an improvement on a thermal fixing unit or a heating unit for heating a developer sheet so as to provide glossy output image without any local image drop out.

In one conventional image recording apparatus, a recording medium is of transfer type recording medium such as a photosensitive sheet which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. The developer sheet includes a base substrate, the developer material layer and a surface resin layer. Such image recording medium is disclosed in, for example, U.S. Pat. No. 4,399,209 and Japanese Patent Application Kokai No. 58-88739.

As is well known, the image recording apparatus of this type irradiates light onto an original and a light reflected from the original or transmitted therethrough passes through an optical system such as a reflection mirror, a filter and lenses, and is focused on the photosensitive recording medium at an exposure unit. As a result, a latent image is formed on the photosensitive recording medium upon photocuring the light exposed microcapsules. Then, the light-exposed photosensitive recording medium is superposed with a developer sheet, and these sheets are pressed together at a pressure developing unit, so that non photo-cured microcapsules are ruptured to react the chromogenic material with the developer material, to thereby provide an output image on the developer sheet. After the pressure developing operation, the developer sheet is delivered to a thermal fixing unit where the output image is thermally fixed and glossy output image is obtained. Further, in case the developer sheet has a PET substrate, such sheet is used as an overhead projector sheet (OHP sheet). In this case, high transparency is required at a surface resin layer and the developer layer, and therefore, complete heating is required for melting these layers.

In the thermal fixing process, a heat roller is used which is in direct contact with the imaging surface of the developer sheet so as to positively heat the surface resin layer. However, upon heating the surface resin layer, viscosity of the resin is increased, and therefore, the output image may be transferred onto the heat roller surface. As a result, partial image drop out may occur at the resultant output image.

Further, in a conventional image recording apparatus, exposure, pressure development and thermal fixing operations are carried out irrespective of the characteristics of the sheet such as the developer sheet size and material of the developer sheet. Accordingly, resultant output image may be insufficient in terms of transparency, resolution power and Haze percent (Haze percent is defined in ASTM D1003).

SUMMARY OF THE INVENTION

It is therefore, an object of the present invention to overcome the above described drawbacks and to provide an improved image recording apparatus which can provide a desirable output image on a developer sheet.

Another object of the invention is to provide the improved image recording apparatus capable of providing glossy output image without any local image drop out.

Still another object of the invention is to provide the image recording apparatus which can provide sufficient transparency and resolutional power in the final output image on the developer sheet.

These are other object of the invention are attained by providing an image recording apparatus for recording an image on an image recording medium, the image recording medium including a photosensitive pressure sensitive recording medium carrying photo-curable microcapsules encapsulating therein a chromogenic material and a photosensitive material, and a developer medium carrying a developer material which is reactable with the chromogenic material for coloring, the image recording apparatus comprising: an exposure unit at which the photosensitive pressure sensitive recording medium is exposed to light for forming a latent image thereon upon photo-curing the microcapsules, a pressure developing unit positioned downstream of the exposure unit, the exposed photosensitive pressure sensitive recording medium and the developer medium being superposed with each other and pressed by the pressure developing unit for forming an output image on the developer medium by the chromogenic reaction, a thermal fixing unit positioned downstream of the pressure developing unit for fixing the output image on the developer medium, the thermal fixing unit being provided with a heat application means for heating the developer medium, the heat application means being positioned spaced away from the output image on the developer medium.

In another aspect of the present invention, there is provided a sheet heating apparatus for heating a sheet which includes a base substrate and a coating layer formed thereover; the heating apparatus comprising: sheet transfer means for transferring the sheet, the sheet transfer means providing a variable transferring speed and defining a sheet path, a heating unit positioned at the sheet path for heating the sheet on the sheet transfer means, and control means connected to the sheet transfer means for controlling the transferring speed of the sheet transfer means in response to a kind of the base substrate.

In still another aspect of the invention, there is provided a sheet heating apparatus for heating a sheet which includes a base substrate and a coating layer formed thereover; the heating apparatus comprising; sheet transfer means for transferring the sheet, the sheet transfer means defining a sheet path, a plurality of heating means for heating the sheet, the heating means being disposed adjacent the sheet path, detection means for detecting a kind of the base substrate, and control means connected between the detection means and the plurality of the heating means for selectively operating at least one of the plurality of heating means in response to a kind of the base substrate.

According to still another aspect of the invention, there is provided an image recording apparatus for recording an image on an image recording medium, the image recording medium including a photosensitive pressure sensitive recording medium carrying photo-curable microcapsules encapsulating therein a chromogenic material and a photosensitive material, and a developer medium carrying a developer material which is reactable with the chromogenic material for coloring, the image recording apparatus comprising: an exposure unit having a light source, a pressure developing unit providing a nipping pressure for pressure developing an image on the image recording medium, an original transfer means for transferring an original during light exposure, a thermal fixing unit having a heating means for heating the developer medium, means for detecting a kind of the developer medium, the detecting means providing an output signal indicative of the kind of the developer medium, and means for controlling an image recording condition in response to the output signal, the image recording condition being at least one of a heating condition defined by the heating means, light irradiation rate provided by the light source for irradiating light to the original, moving speed of the original transfer means, and pressure level of the pressure developing unit.

According to still another aspect of the invention there is provided an image recording apparatus comprising: a pressure developing unit where a cut developer medium and a photosensitive pressure sensitive recording medium carrying a latent image thereon upon light exposure are superposed with each other and pressed together for producing a visible image on the cut developer medium, a thermal fixing unit having a heater for fixing an output image on the developer medium which is passable therethrough, detection means for detecting an interval length between a precedent developer medium and a subsequent developer medium, the detection means being provided upstream of the thermal fixing unit, control means for controlling one of the heater and a transfer speed of the developer medium relative to the thermal fixing unit upon detection of the interval length.

DETAILED DESCRIPTION OF THE PREFERRED EMBODIMENTS

Figure 1:
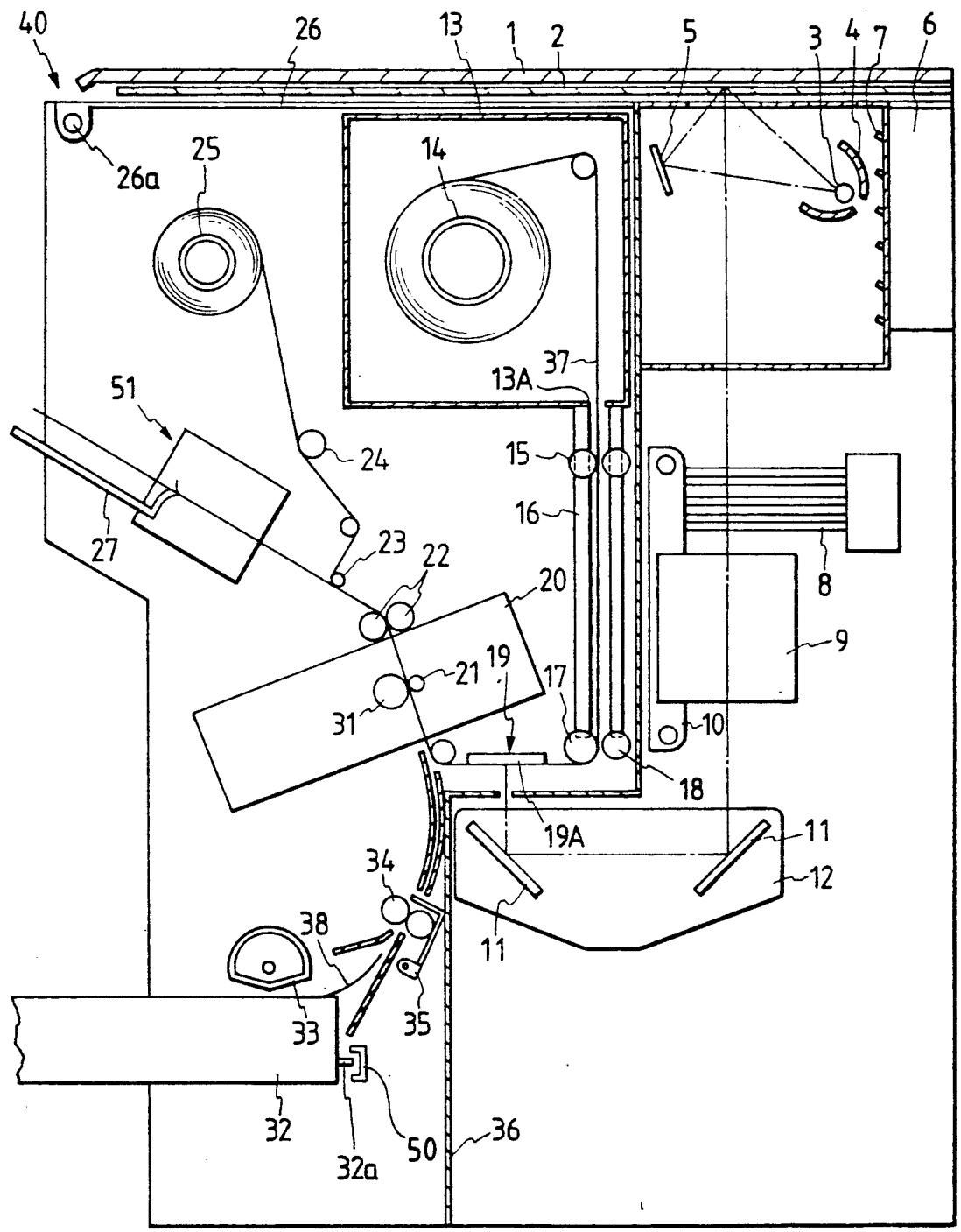
FIG. 1 is a schematic side elevation showing an image recording apparatus in the present invention.

FIG. 1 shows a copying machine capable of performing a full-color copying. This copying machine employs the above-described transfer type image recording mediums including a microcapsule sheet 37 and a developer sheet 38. The developer sheet has a surface resin layer formed of a thermally fusable resin coated over the developer material which is formed over a base substrate formed of a paper having low thermal capacity or PET (polyethylene terephthalate) having high thermal capacity.

As shown in FIG. 1, the copying machine 40 generally includes an exposure unit 19 having an exposure stand 19A and a pressure developing unit 20. Further, a light shielding cover plate 36 is disposed in the apparatus to spacedly divide the apparatus into an optical system and other requisite units. The elongated web-like microcapsule sheet 37 is wound around a cartridge shaft 14, and is retained in a microcapsule sheet cartridge 13 that is detachably disposed at a position immediately below an original support stand glass 2 and is formed with a bottom opening 13A. In other words, the cartridge 13 storing therein non light exposed microcapsule sheet 37 is positioned at an upper portion of the apparatus 40. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

At downstream side of the pressure developing unit 20, a pair of feed rollers 22 are provided so as to provide constant running speed of the microcapsule sheet 37. This speed is coincident with horizontally moving speed of the original support stand glass 2.

At downstream side of the feed rollers 22, a separation roller unit 23 which provides a meandering sheet path is provided at which the microcapsule sheet 37 is separated from the developer sheet 38. The separate microcapsule sheet 37 is taken-up by the above mentioned take up means 25 through a meander travel control roller 24. On the other hand, thermal fixing unit 51 is provided at the downstream side of the separation roller 23. The thermal fixing unit 51 includes a heating unit (described later) for heating the developer sheet 38 carrying an output color image. Further, a discharge tray 27 is provided at downstream side of the thermal fixing unit 51.

As shown in FIG. 1, the copying machine 40 has its top plate portion provided with a stand cover 1 and the original support stand glass 2. The original support stand glass is formed of light transmissive material and is movable in the horizontal direction and on which a desired original (not shown) is to be placed. Further, an inner cover 26 is hingedly supported to a main frame as at 26a. At the upper one side section (right side in FIG. 1) of the copying machiner 40, fixedly provided is a light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon.

The original support stand cover 1 which covers the top surface of the glass 2 is provided in order to prevent this light from leakage out of the apparatus.

To irradiate the light from the halogen lamp 3 on the original at a high efficiency, a flat reflector 5 is disposed on one side of the light source. The second reflector 5 is adapted to reflectingly direct lights which do not directly direct toward the original from the light source and concentrate such reflected light onto the original.

At another side of the halogen lamp 3 there are provided a fan 6 and a louver 7 for introducing an external air into the apparatus. Accordingly, air is effectively impinged onto the light source 3 to cool the same.

A filter 8 is disposed below the original support stand glass 2. Further, a lens 9 is provided below the filter 8. Light emitted from the halogen lamp 3 and reflected at the original place on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable. A pair of reflection mirrors 11 and 11 are provided below the lens 9. The condensed lights passing through the lens 9 change their direction by 180 degrees (completely reverse direction) by the two reflection mirrors 11 and the thus oriented lights impinge on the microcapsule sheet 37 closely contacting the bottom of the exposure table 19 to form the latent image thereon. The two reflection mirrors 11 are securely mounted to a mirror mounting plate 12, so that the adjustment of the length of the light path and focusing adjustment can be effected by fine adjustment of the position of the mirror mounting plate 12.

Operation of the copying apparatus will be described:

The microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37.

More specifically, the original support stand cover 1 is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is coming into confrontation with the light source. Thereafter, with the halogen lamp 3 being lighted, the original support stand glass 2 is then moved in a second direction (leftwardly in FIG. 2) opposite to the first direction. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19 to form the latent image on the sheet 37. At this time, since the microcapsule sheet 37 is moved under the exposure table 19 in the second direction (leftwardly in FIG. 1) at the same speed as the moving speed of the original support stand glass 2, the latent image corresponding to the original image is formed on the microcapsule sheet 37. Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing along the lower surface of the exposure table 19A.

The sheet is then fed to the pressure developing unit 20 by the guide roller 17. At the pressure developing unit, the sheet 37 is pressurizingly superposed with the developer sheet 38. An unexposed portion of the microcapsule sheet 37 leaving the cartridge 13 is kept unexposed to light by the shielding cover 36. The developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist gate 35.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

In summary, in timed relation with the movement of the original support stand glass 2 in the second direction, the sector roller 33 feeds out the developer sheets 38 one by one from the developer sheet cassette 32. The developer sheet 37 superposed on the light-exposed microcapsule sheet 37 is fed to the pressure developing unit 20, and the latent image on the microcapsule sheet 37 is developed and transferred onto the developer sheet 38.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 51 and is then discharged onto the discharge tray 27 with its image surface up. Meanwhile, the microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 1) of the glass 2 confronts the light source, the copying of the original is completed and the halogen lamp 3 is turned off.

The above described color copying machine is substantially the same as that disclosed in a copending U.S. patent application Ser. No. 281,327 filed on Dec. 8, 1988.

Figure 2:
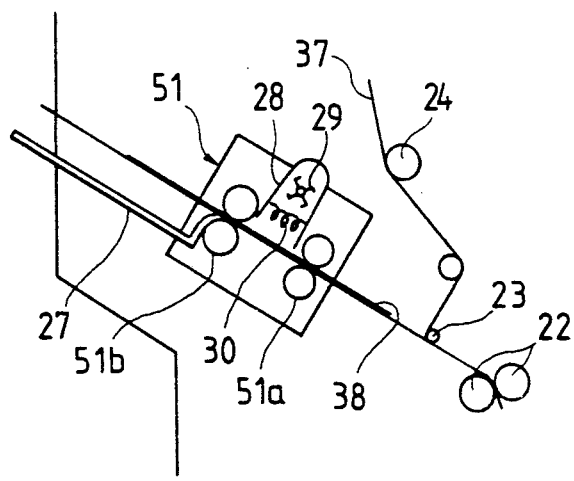
FIG. 2 is a schematic view showing a thermal fixing unit according to a first embodiment of this invention.

Now according to a first specific embodiment of the present invention, as shown in FIG. 2, the thermal fixing unit 51 has the heating unit which includes a heat generating element 30 and a heating section 28 accommodating therein a fan 29. The thermal fixing unit 51 also includes a feed rollers 51a and 51b for feeding the developer sheet 18. The thermal fixing unit 51 is preferably sealingly maintained so as to confine therein a hot air blown by the fan 29 and heated by the heat generating element 30. In other words, slits are only formed so as to allow the developer sheet 38 to pass through the unit 51.

With this structure, when the developer sheet 51 carrying the output image which has been provided at the pressure developing unit 20 enters the thermal fixing unit 51, air blown by the fan 29 is heated by the heat generating element 30 and the hot air is applied to the developer sheet 38. As a result, the developer sheet 38 is heated and coloring is promoted. Further, in this instance, a surface resin layer of the developer sheet 38 is thermally melted, and a smooth or flat surface is obtainable. The surface resin layer is naturally cooled and solidified after the sheet 38 passes over the thermal fixing unit 51. Accordingly, the output imaging surface of the developer sheet becomes a glossy surface.

In this embodiment, since the hot air is recirculated within the thermal fixing unit, power saving results. Further, most importantly, the imaging surface of the developer sheet can be heated by non-contact type heating, i.e., by applying the hot air at the thermal fixing unit. Therefore, excellent coloring promotion is attainable, and full output glossy image is obtainable without any image chipping off which had been conventionally occurred due to output image transfer to a heat roller in the thermal fixing unit due to the direct contact between the heat roller and the imaging surface at the thermal fixing unit.

Figure 3:
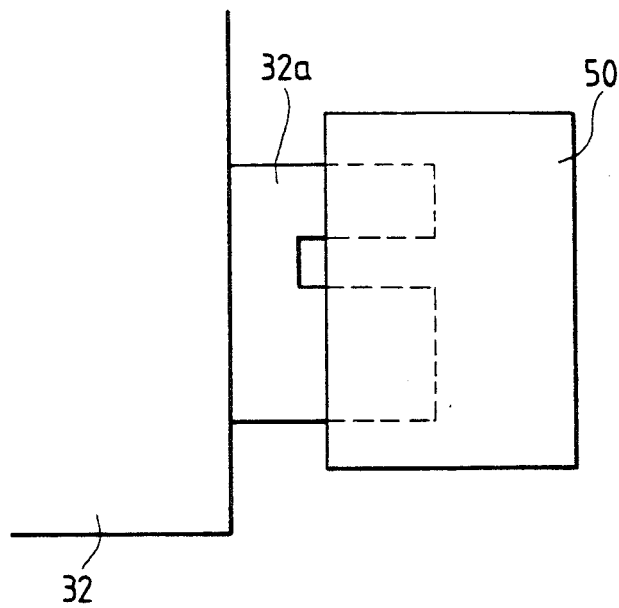
FIG. 3 is a schematic plan view showing a sheet identification means according to the first embodiment of this invention.

In the first embodiment, there is further provided a developer sheet identification means 50 provided at the frame of the apparatus 40 as shown in FIG. 3. The cassette 32 has a sheet exit side provided with a protrusion 32a. The shape of the protrusion 32a is dependent on a kind of the developer sheet 38. The identification means 50 detects a shape of the protrusion 32a to identify the kinds of the developer sheet 38.

The sheet identification means 50 is connected to at least one of the halogen lamp 3, the original support stand glass 2, the pressure developing unit 20 and the thermal fixing unit 51. In accordance with the kinds of the developer sheet 38 which kinds is detected by the identification means 50, the identification means sends a signal indicative of a copying condition. For example, the signal is indicative of the light irradiation amount of the halogen lamp 3, moving speed of the original support glass 2, nipping pressure of the pressure rollers 21 and 31 of the pressure developing unit 20, a temperature at the thermal fixing unit 51. In the latter case, the signal controls the air blowing amount or air velocity of the fan 29. Alternatively, the signal controls the temperature at the heat generating element 30.

More specifically, if the developer sheet is formed of OHP sheet, the temperature for the thermal fixing operation is elevated in comparison with the white paper. Alternatively, air blowing amount and velocity are increased so as to promote transparency at the outer surface layer of the OHP sheet. In case of a thick paper, the nipping pressure is increased.

Instead of the provision of the sheet identification means 50, a panel switches (not shown) may be provided so as to select optimum copying condition in accordance with the kinds of the developer sheet to thereby control at least one of the fan 29, the heat generating element 30, pressure developing roller 21, the halogen lamp 3 and the original support glass 2.

Therefore, in this embodiment, optimum output image can be obtained by providing an optimum copying condition in response to the sheet kind.

Furthermore, the invention is not limited to the copying apparatus as described above, but is available for other types of copying system. For example, the photosensitive recording medium 37 is in intimate contact, at the exposure unit 19, with a color resolution mask which is obtained from a colored original by a trichromatic color resolution.

A second embodiment according to this invention will next be described with reference to FIGS. 4 and 5. The second embodiment pertains to an improvement on the first embodiment. That is, in the thermal fixing unit 51 in the first embodiment, circulated hot air may not be uniformly applied to the developer sheet 38. Particularly, the sheet portion at a position spaced away from the heat generating element 30 may not undergo sufficient heating, since thermal capacity of the air is relatively low. In this connection, travelling speed of the developer sheet 38 must be lowered so as to obtain sufficient heating at entire portion thereof at the thermal fixing unit. As a result, image productivity or throughput may be lowered.

In the second embodiment, general structure of the copying machine is identical with the machine shown in FIG. 1. However, in the third embodiment, an improved thermal fixing unit 123 is provided as shown in FIGS. 4 and 5.

The thermal fixing unit 123 includes a pair of rollers 131 and 131 mounting a metalic endless belt 132 therebetween for feeding the developer sheet 38. The endless belt 132 serves as a sheet transferring means which transfers the developer sheets 38 upon rotation of the roller 131 about its axis. At an upper portion of the endless belt 132, a cover 133 is provided. The cover 133 has an open end at its lower edge, and is formed with a sheet inlet 133a and a sheet outlet 133b at both side ends.

A space is provided between the endless belt 132 and the cover 133, and a cross-flow fan 134 is provided at the inlet side 133a within the space. The fan 134 is rotatable about an axis extending perpendicular to the sheet travelling direction. Further, a motor 135 is provided at an external surface of the cover 133 so as to rotate the fan 134 in a direction indicated by an arrow in FIG. 4.

Further, a guide member 136 is provided within the cover 133 so as to define an air passage 137 which extends along the sheet travelling direction. Upon rotation of the fan 134, air is circulated along the air passage 137 and along an internal surface of the cover 133.

Within the space and at a position adjacent the sheet inlet 133a, and at an approximately intermediate portion of the air passage 137, Nichrome wire coils 138 and 139 are provided. respectively. These Nickrome coils serve as heat generating elements. Therefore, the heat generating elements 138 and 139 are positioned spaced away from each other and along the sheet travelling direction. Further, these elements 138 and 139 are spaced away from the endless belt 132 by a given distance. Accordingly, when electrical current is applied to the wire coils 138 and 139, ambient air confined within the space is heated.

Figure 4:
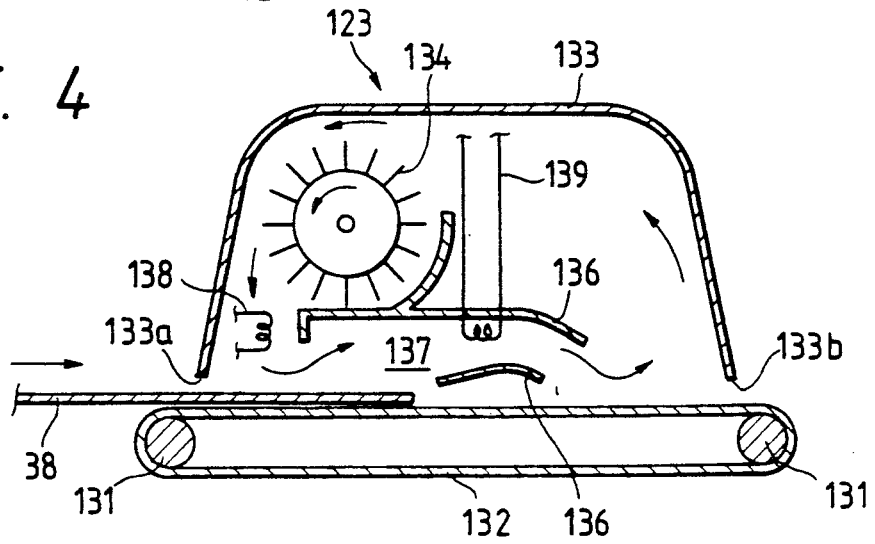
FIG. 4 is a cross-sectional view showing a thermal fixing unit or a heating unit according to a second embodiment of this invention.
Figure 5:
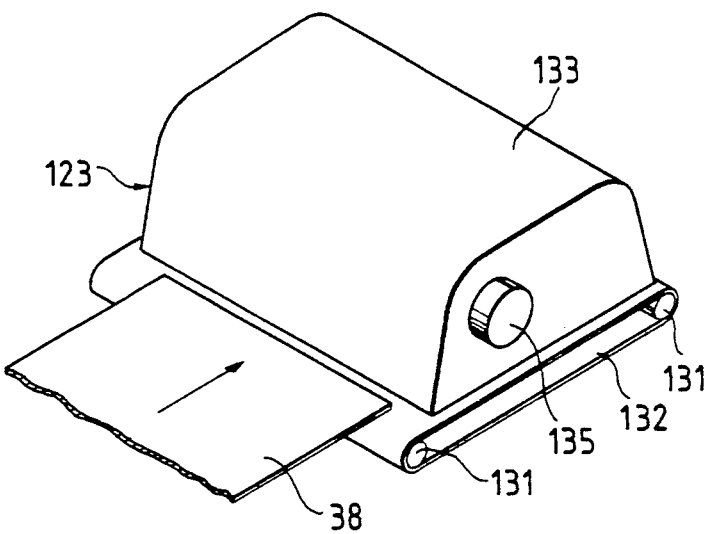
FIG. 5 is a perspective view showing the thermal fixing unit in the second embodiment.

With this structure, according to the thermal fixing unit 123 of the second embodiment, hot air stream as indicated by arrows in FIG. 4 is provided within the internal space of the cover 133 when the fan 134 and the heat generating elements 138 and 139 are operated. In accordance with the running of the belt 132, the developer sheet 38 is introduced into the unit 123 through the sheet inlet 133a and is discharged therefrom through the sheet outlet 133b. When the developer sheet 38 is in the fixing unit 123, the sheet 38 is heated by the air flow, so that the color output image is fixed on the sheet 38.

Since the plurality of heat generating elements 138 and 139 are provided along the travelling direction of the developer sheet 38 for directing hot air along the travelling sheet, local heating thereto can be obviated even if heating area is expanded. Even over the elongated heating area, approximately uniform hot air temperature can be provided regardless of specific positions. Therefore, travelling speed of the developer sheet can be increased to thereby enhance throughput.

Further, in this embodiment, since the air stream is provided along the travelling direction of the developer sheet, no sheet curling occur at the sheet inlet and outlet 133a and 133b. It goes without saying that the numbers of the heat generating elements is not limited into two, but can be increased if desired. Further, a plurality of feed rollers may be available as the sheet transferring means instead of the endless belt. Furthermore, this fixing unit is also available to a monochromatic copying machine.

Figure 6:
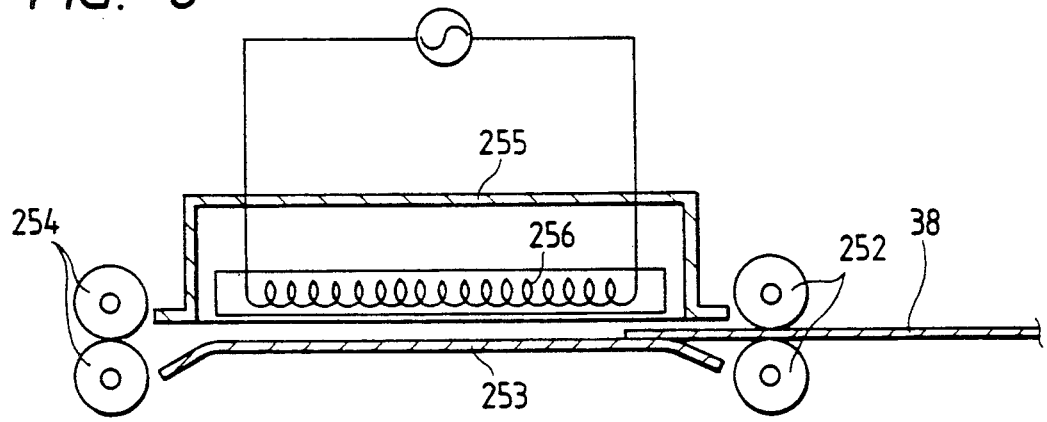
FIG. 6 is a cross-sectional view showing an inhouse proposal with respect to a thermal fixing unit.

There is one inhouse proposal in non-contact type heating to the developer sheet 38 at a thermal fixing unit as shown in FIG. 6. The developer sheet 38 is transferred onto a guide plate 253 by a pair of feed in rollers 252, and then, the sheet 38 is discharged by a pair of feed out rollers 254. During this sheet travel, a plate-type heater 256 disposed above the guide plate 253 and covered with a cover member 155 performs radiant heating to the sheet 38.

Figure 7:
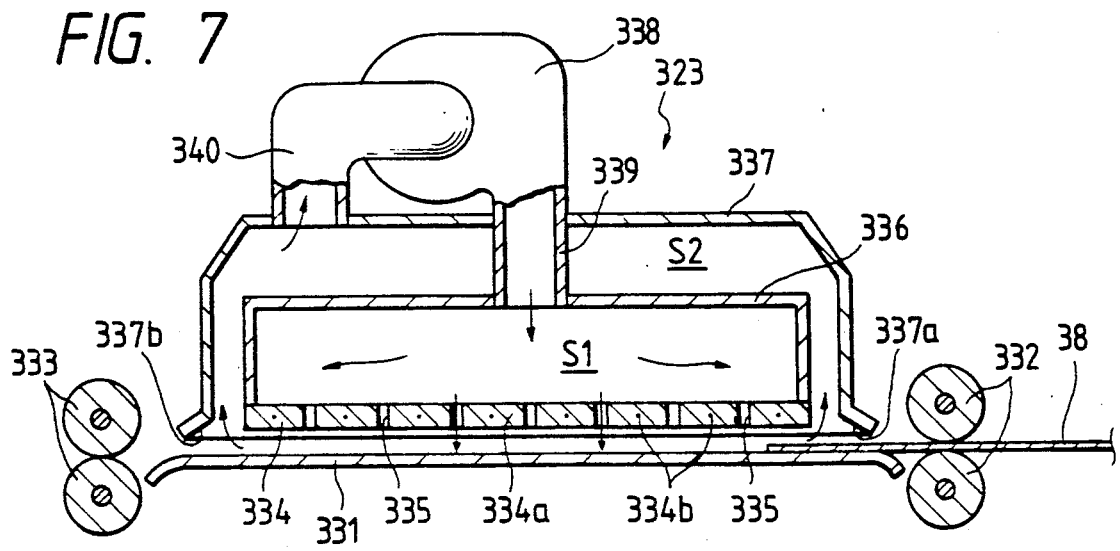
FIG. 7 is a cross-sectional view showing a thermal fixing unit or a heating unit according to a third embodiment of this invention.
Figure 8:
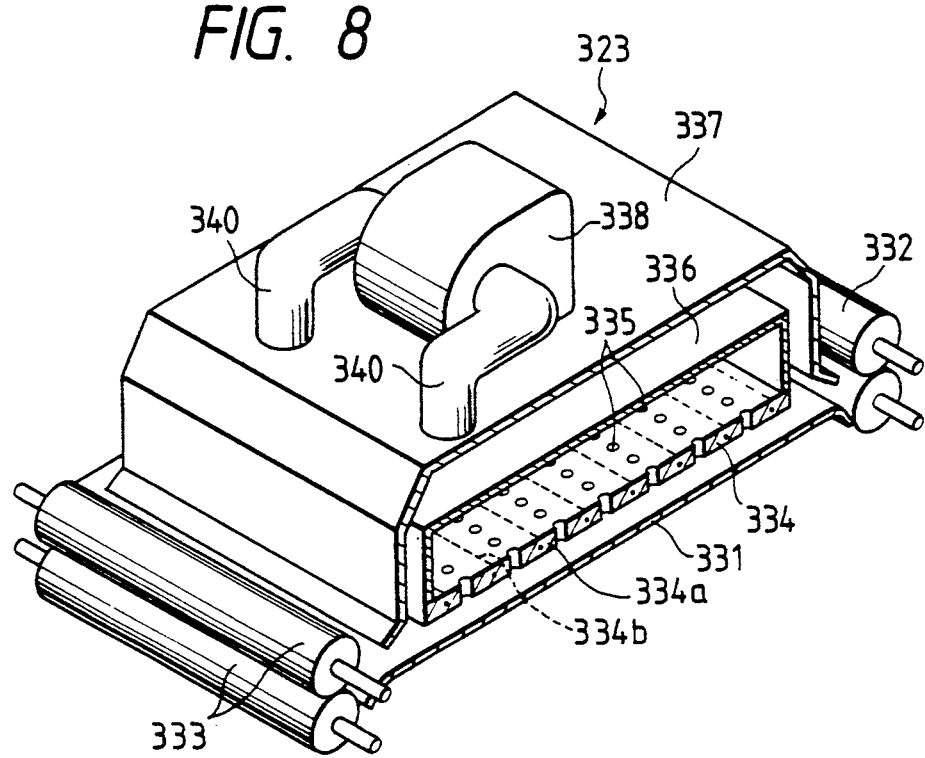
FIG. 8 is a perspective view showing the thermal fixing unit in the third embodiment.

According to this proposal, it would be difficult to efficiently utilize a heat of the plate heater 156, since no thermal transmission is conducted by way of a convextion. As a result, heat treatment to the sheet 38 requires great period of time, and accordingly, overall copying speed may be lowered. With the above inhouse proposal in view, a thermal fixing unit 323 according to a third embodiment of the present invention is provided as shown in FIGS. 7 and 8.

The thermal fixing unit 323 includes a guide plate 331 on which the developer sheet 38 is travelled. At one distal end of the guide plate 331 a pair of feed in rollers 332 is provided, and at another distal end of the plate 331, a pair of feed out rollers 333 are provided. These rollers 332 and 333 are rotatable about their axes extending in a direction perpendicular to the travelling direction of the developer sheet 38. Upon rotations of these rollers, the developer sheet 38 can be travelled over the guide plate 331.

A plate heater 334 is disposed above the guide plate 331 for heating the sheet 38. The plate heater 334 is spaced away from the guide plate 331. The plate heater 334 consists of electrically insulative plate 334a formed of a ceramic material such as a magnesia and endless Nichrome wires 334b embedded in the insulative plate 334a and extending in a direction perpendicular to the travelling direction of the developer sheet 38. A plurality of through holes 335, are formed in the insulative plate 334a at positions adjacent to the embedded positions of the Nichrome wires 334b.

An auxiliary cover member 336 is provided for covering the plate heater 334 and for defining a space S1, and a main cover member 337 is provided for covering the auxiliary cover member 336 and the guide plate 331 and for defining a space S2. The main cover member 336 has both sides formed with a sheet inlet 337a and a sheet outlet 337b, respectively. The main and auxiliary cover members 336 and 337 constitute a covering means.

A blower 338 which houses therein a fan (not shown) is provided above the main cover 337 for blowing air toward the plate heater 334. An air supply tube 339 is connected to the blower 338 and extends into the space S1 through the main cover 337. Further, a pair of recirculation pipes 340 are connected between the blower 338 and the space S2 defined between the main and auxiliary covers 336 and 337.

Therefore, in the above thermal fixing unit 323, the developer sheet 38 nipped between the pair of feed rollers 332 is delivered onto the guide plate 331 by the rotation of the feed rollers 332, and when a leading edge of the developer sheet 38 reaches the feed out rollers 333, the sheet 38 is discharged through the sheet outlet 337b by the rotation of the feed out rollers 333.

During travel of the developer sheet 338 on and along the guide plate 331, electrical current is applied to the Nichrome wires 334b, so that the developer sheet 38 is directly heated by the radiant heat.

Further, upon actuation of the blower 338, air streams shown by arrows in FIG. 7 are generated. The air stream initially passes through the air supply tube 339 and enters the space S1 where the air is heated by the radiant heat generated by the Nichrome wires 334b. The thus heated air pass through respective through holes 335 formed in the plate heater 334 and impinge on the surface of the developer sheet 338. Then the heated air pass through the space S2 and the recirculation tubes 340 and reach the blower 338.

Therefore, the developer sheet 338 can be subjected to heating by the convection heating as well as radiant heating. As a result, a heat generated by the plate heater 334 can be efficiently utilized, so that the output image on the developer sheet can be promptly fixed, to thereby enhance overall copy processing speed.

Several modification may be made on the third embodiment. For example, the plate heater can be formed of a single material instead of the composite materials. Further, an endless belt can be used instead of the guide plate and the feed in feed out rollers. Futhermore, the third embodiment is available for a monochromatic copying machine.

A fourth embodiment will next be described with reference to FIGS. 9 thru 13(d). The fourth embodiment pertains to an improvement on the foregoing embodiments with respect to curling of the developer sheet 38.

As described above, the developer sheet 38 has the surface resin layer formed of thermally fusable resin. This resin material may be shrinked during heating and cooling process to the developer sheet. Due to this shrinkage, the developer sheet may be curled toward the output imaging surface thereof. Therefore, the curled edge portion of the developer sheet may be separated from the endless belt 132 (FIG. 4) or the curled portion may be entered into the air duct opening 337b (FIG. 7). Further, such curled sheet may be in sliding contact with the cover member, to thereby deteriorate or degrade the output imaging quality, and sheet jamming may occur.

In view of the above, according to the fourth embodiment of this invention, engaging projections 434 are provided for preventing the developer sheet from being floatedly travelled through the thermal fixing unit 423.

In the fourth embodiment, arrangements of heat generating elements 442A and 442B, a cross flow fan 438, a cover member 437, sheet inlet and outlet 437a and 437b and a guide member 440 for defining an air passage 441 are substantially the same as those shown in the second embodiment shown in FIG. 4.

Figure 9:
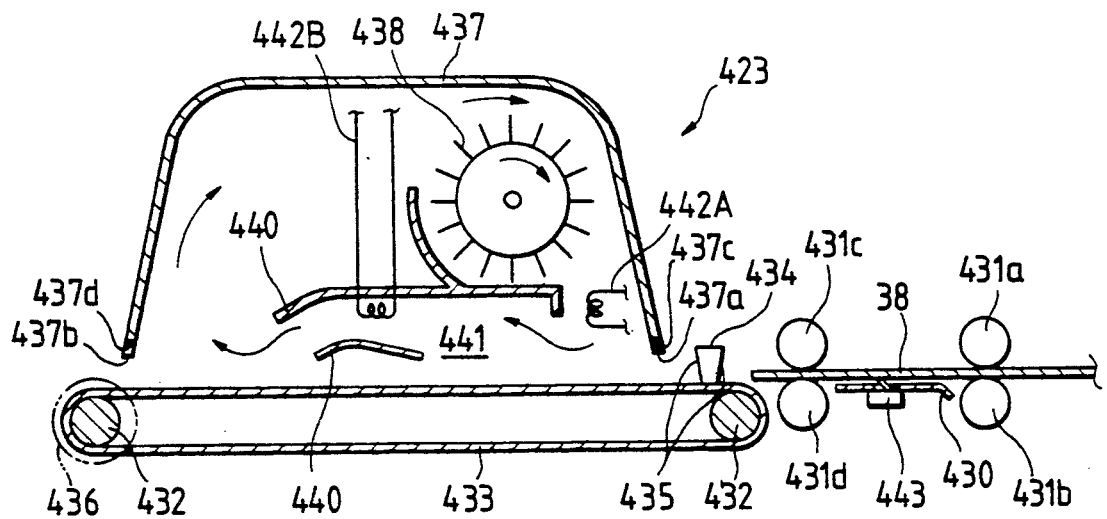
FIG. 9 is a cross-sectional view showing a thermal fixing unit or a heating unit according to a fourth embodiment of this invention.
Figure 10:
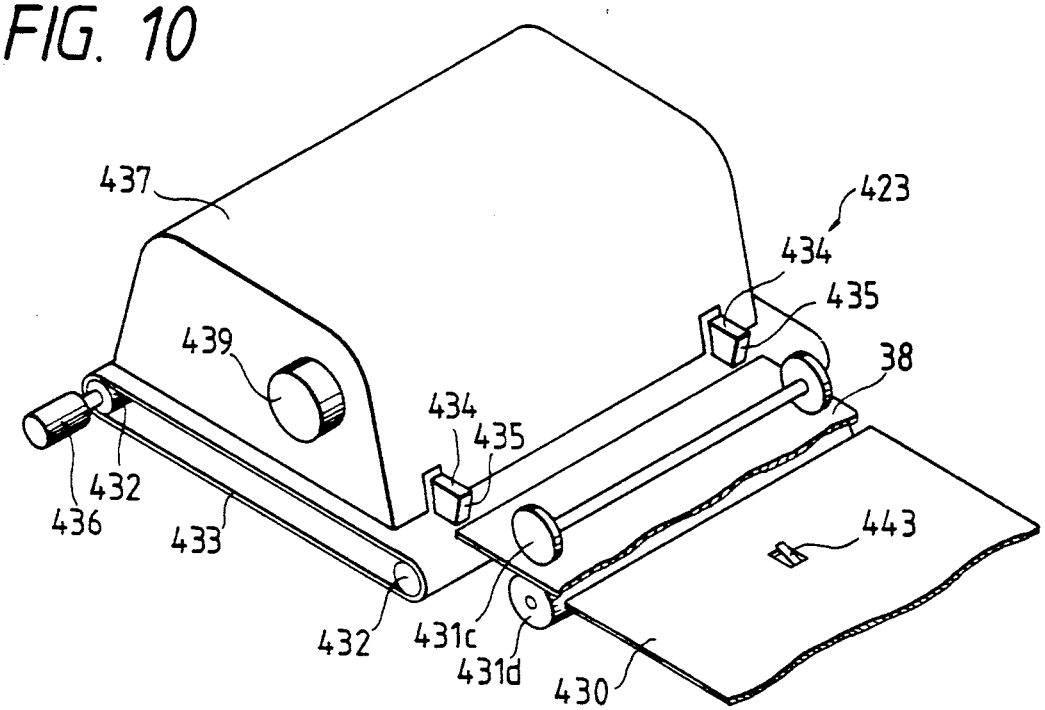
FIG. 10 is a perspective view showing the thermal fixing unit in the fourth embodiment.

As shown in FIGS. 9 and 10, at a position immediately upstream side of the thermal fixing unit, a guide plate 430 is disposed at a sheet path, and each pair of feed rollers 31a–31d are rotatably provided at both ends of the guide plate 430. These rollers are driven by a drive motor (not shown) and are rotated about their axes extending in a direction perpendicular to the travelling direction of the sheet 38. Slip rollers having low frictional force relative to the sheet 38 are used as the feed rollers.

Further, a pair of rollers 432 and 432 are disposed to mount therebetween an endless belt 433 formed of silicone rubber. One of the rollers 432 is connected to a drive motor 436 for its rotation at a peripheral rotation speed equal to that of the feed rollers 431a–431d.

Figure 13A:
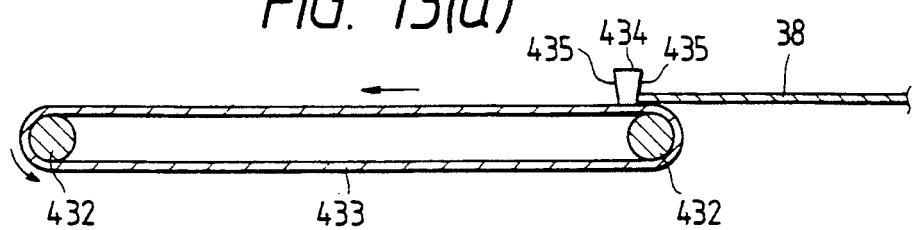
FIGS. 13(a) thru 13(d) show views for description of the developer sheet transferring phases in the fourth embodiment.

The transfer belt 433 has a lateral side edge portions provided with a pair of engaging projections 434 which are engageable with the leading edge of the sheet 38 in order to prevent the sheet 38 from being curled or floated. The pair of engaging projections 434 are brought to a position immediately upstream of the sheet inlet 437a at non-operating state of the transfer belt 433 as shown in FIGS. 9 and 13(a).

Figure 11:
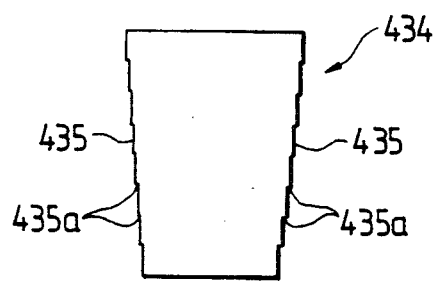
FIG. 11 is a cross-sectional view showing an engaging projection used in the fourth embodiment.

As best shown in FIG. 11, each of the engaging projections 434 has engaging surfaces 435 at both front and rear sides relative to the travelling direction of the sheet 38. Width of the engaging projection 432 is gradually reduced in downward direction, so that the front and rear engaging surfaces 435 are slantingly provided. Further, a plurality of engaging steps 435a are formed at both front and rear engaging surfaces 435. Incidentally, in the fourth embodiment, a length of the endless belt 433 is set equal to a sum of a longitudinal length of B4 size sheet (364 mm) and a length (distance between front and rear engaging surfaces) of the engaging projection 434.

When the developer sheet 38 is introduced onto the endless belt 433 by the feed rollers 430a–430d for engaging the leading edge of the sheet 38 with the engaging projections 434, the drive motor 436 is energized for moving the transfer belt 433 to thereby transfer the developer sheet 38. The cover member 437 is formed with notched portions 437c and 437d at positions contiguous with the sheet inlet and outlet 437a and 437b so as to allow the engaging projections 434 to pass therethrough.

Figure 12:
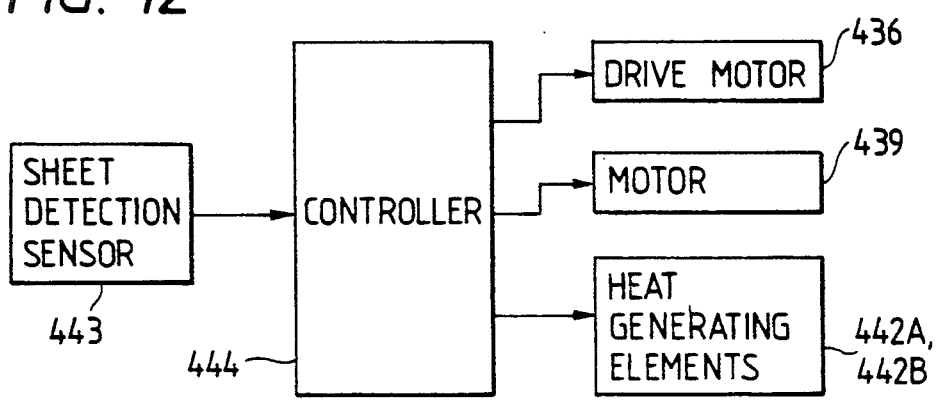
FIG. 12 is a block diagram showing an electrical connections employed in the fourth embodiment.

As shown in FIGS. 9, 10 and 12, a sheet sensor 443 is provided at the guide plate 430 for detecting the sheet travelling thereon. The sheet detection signal is sent to a controller 444. The drive motor 436, the motor 439 and the heat generating elements 442A and 442B are connected to the controller 444. After time elapse counting from the sheet detection timing detected by the sensor 443 to the engagement timing achieved between the leading edge of the sheet 38 and the engaging projections 434, the controller 444 sends a drive signal to the drive motor 436 for permitting the transfer belt 433 to make two rounds.

Further, simultaneously, the controller send signal to the heat generating elements 442A and 442B for their heating, and sends a drive signal to the motor 439 for generating hot air stream within the cover member 437.

Operation mode in the fourth embodiment will next be described.

When the developer sheet 38 is transferred over the guide plate 430 by the rotation of the feed rollers 431a-431d and the leading edge of the sheet reaches the sheet detection sensor 443, the transfer belt 433 is not driven. Therefore, as shown in FIG. 13(a), when the leading edge of the sheet 38 engages the engagement surfaces 435 of the engaging projections 434, the feed rollers 431a-431d are freely rotated, so that the position of the developer sheet 417 is regulated. After predetermined time elapse counting from the sheet detection by the sensor 443, the drive motor 436 is energized for moving the transfer belt 433. Simultaneously, electrical current is applied to the heat generating elements 442A and 442B and the motor 439 is energized for generating hot air stream within the cover member 437.

Figure 13B:
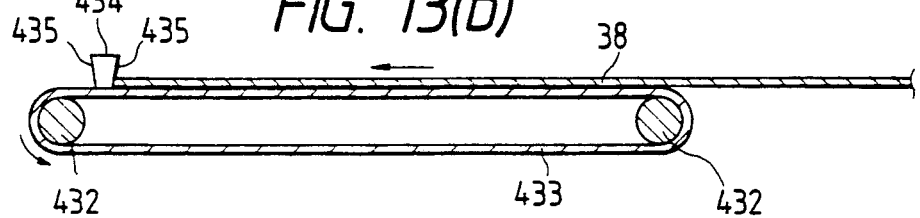

Upon movement of the transfer belt 433, the developer sheet 38 is introduced into the cover 437 through the sheet inlet 437a with the leading edge of the sheet 38 being engaged with the tail end side engagement surfaces 435, since the feeding speed of the transfer belt 433 is equal to the feeding speed of the feed rollers 431a-431d as shown in FIG. 13(b). Until the engaging projections 434 reach the sheet outlet side, the developer sheet 38 is heated by the hot air stream, so that the surface resin layer and the developer material are melted, and then are cooled. During this cooling or solidifying phase, the surface resin layer and the developer material may be shrinked, so that the developer sheet 38 may be urged to be bent or curved toward the output imaging surface thereof. However, in this case, no curling of the sheet particularly at the edge portion thereof occurs, since the leading edge of the sheet is in frictional contact with the engagement surfaces 435 or is engaged with the engagement steps 435a. Accordingly, the leading edge of the sheet 38 can be smoothly travelled through the sheet outlet 437b without any sheet jamming, and as a result, the sheet can be smoothly discharged out of the cover member 437.

Figure 13C:
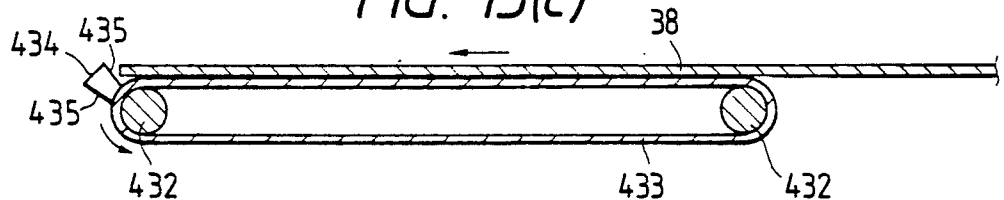

Further, as shown in FIG. 13(c), in accordance with the further travel of the transfer belt 433, the engaging projections 434 are moved along the peripheral moving locus at the roller 432. Therefore, the leading edge of the sheet 38 can be disengaged from the engaging projections 434. In accordance with the movement of the transfer belt 433, overall area of the developer sheet 38 is subjected to thermal fixing, and the sheet is discharged from the cover 437. Upon completion of twice laps of the transfer belt 433, the belt movement is terminated at a position shown in FIG. 13(a).

Figure 13D:
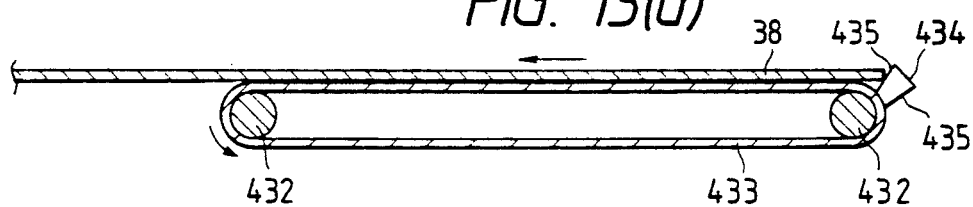

If the developer sheet 38 has B4 size, a leading edge side engaging surface 435 is brought into engagement with the tail edge of the developer sheet 38 at the initial stage of the second lap of the belt travel as shown in FIG. 13(d). Therefore, sheet curling at the tail edge portion can be eliminated even by the thermal contraction of the surface resin layer and the developer material. As a result, sheet floating relative to the transfer belt 433 is avoidable.

In view of the foregoing, in the fourth embodiment, any sheet jamming due to curling or curving of the sheet can be avoided, since the engaging projetions 434 are provided at approximately lateral side edge portions of the transfer belt 433, and since the engaging projection 434 has the upper end portion having a width larger than that of the lower end portion for providing slanting engagement surfaces where engagement steps are formed. The leading edge of the developer sheet can be securely engaged with the engaging projections 434, to thus avoid thermal deformation of the sheet due to thermal contraction of the surface resin layer and the developer material. Further, during melting condition of the surface resin layer and the developer material, only one of the leading edge or tail edge portion of the sheet 38 is in abutment or engagement with the engaging projections 434. Therefore, no direct contact between the output image and the projections occur, to thereby protect the output image in a desirable state.

Furthermore, in the fourth embodiment, engagement between the leading edge of the sheet 38 and the engaging projections 434 can be maintained without any disengagement, since the feeding speed of the feed rollers 431a-431d is set equal to the feeding speed of the transfer belt 433 with maintaining the abutment of the sheet leading edge with the engaging projections. As a result, the sheet floating relative to the belt can be further obviated.

Moreover, in the fourth embodiment, the entire length of the transfer belt 433 is equal to the sum of the longitudinal length of the B4 size sheet (364 mm) and the width of the engaging projection, the leading edge of the sheet 38 is firstly abutted on the tail end surface of the engaging projection, and at the initial phase of the second circular movement of the transfer belt 433 the tail edge of the sheet is abutted on the leading end surface of the engaging projection. As a result, curling at the tail end portion of the sheet can be avoided.

Several modifications may be made on the fourth embodiment. For example, engagement steps 435a may not be formed at the slanting engaging surfaces 435 for contemplating only the frictional contact relative to the sheet edge. Alternatively, the engaging surfaces 435 may be vertically oriented with forming engaging steps for contemplating only the locking engagement relative to the sheet edge. Further, more than two engaging projections may be provided at the transfer belt 433. Furthermore, in the thermal fixing unit, various heating modes may be available such as radiant heating and convection heating or combination thereof. Moreover, a touch switch is used as the sheet detection sensor. However, a photoelectrical sensor is also available.

A fifth embodiment of this invention will be described with reference to FIGS. 14 thru 16 (c). The fifth embodiment pertains to an improvement on a guide plate in a thermal fixing unit so as to further prevent the developer sheet from being curled or curved which may be caused by thermal contraction of a surface resin layer and a developer material.

In the foregoing embodiments, the developer sheet 38 is heated by radiant heating and/or convection heating. In the latter case, hot air is blown to the surface of a flat developer sheet. If there is deviation or irregularities in hot air flow, temperature distribution may be varried, to thereby degrade uniformity in heating the surface of the developer sheet.

Figure 14:
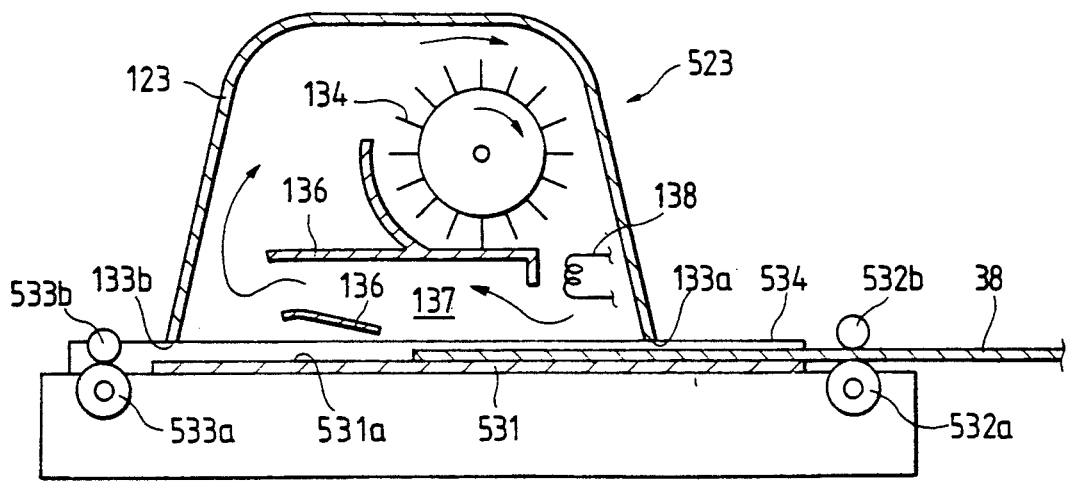
FIG. 14 is a cross-sectional view showing a thermal fixing unit or a heating unit according to a fifth embodiment of this invention.

As shown in FIG. 14, a thermal fixing unit 523 in the fifth embodiment includes a cover member 123 having a sheet inlet 133a and a sheet outlet 133b, a cross flow fan 134, a air guide plate 136 defining a hot air passage 137 and a heat generating element 138 such as Nichrome wire. Those components are the same as those in the foregoing embodiments, and therefore, further explanation is negligible.

Figure 15:
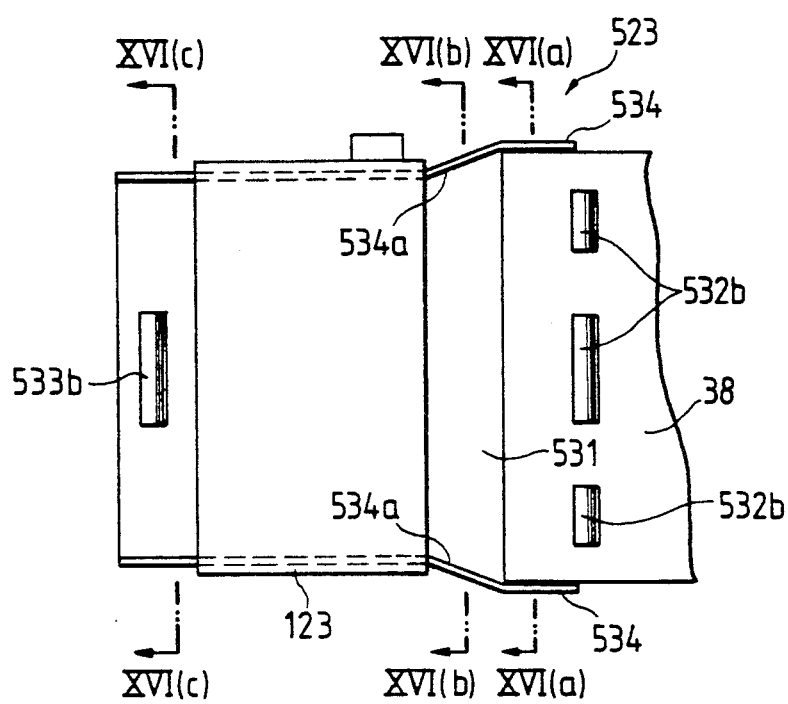
FIG. 15 is a plan view showing an essential portion of the heating unit in the fifth embodiment.

In FIGS. 14 and 15, a sheet guide plate 531 formed of iron is provided below the cover member 123. The sheet guide plate 531 has a sheet guide surface 531a on which the developer sheet 38 is travelled. At immediately upstream side of the guide plate 531, a feed in roller 532a is provided which is rotatable about an axis extending in a direction perpendicular to the sheet travelling direction. Above the feed in roller 532a, a plurality of nip rollers 532b are provided as best shown in FIG. 15. The nip rollers 532b are provided spaced away from each other and extend in a direction parallel with the axial direction of the feed in roller 532a (in the fifth embodiment, three nip rollers 532b are provided). Further, at immediately downstream side of the guide plate 531, a feed out roller 533a is provided rotatable about its axis extending in a direction perpendicular to the sheet travelling direction. Above the feed out roller 533a, a single nip roller 533b is rotatably provided. These feed in roller 532a, the nip rollers 532b, the feed out roller 533a and the nip roller 533b serve as a sheet transferring means. Upon rotations of these rollers, the developer sheet 38 can be travelled on and along the guide surface 531a of the sheet guide plate 531.

A pair of guide plates 534 are provided integral with the sheet guide plate 531. These guide plates 534 are provided at lateral side portions thereof and extend approximately in parallel with the sheet travelling direction. One ene of the guide plates 534 is positioned adjacent the nip rollers 532a, and another end of the guide plates 534 is positioned at downstream side of the nip roller 533a. At intermediate portion of the guide plates 534 with respect to the longitudinal direction thereof, there are provided slant portions 534a. A distance between the opposing slant portions 534a is gradually reduced in the sheet travelling direction as shown is FIG. 15.

Figure 16A:
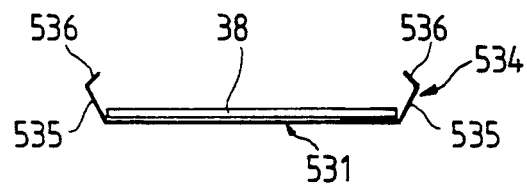
FIG. 16(a) thru 16(c) are cross-sectional views taken along the lines XVI(a)—XVI(a) thru XVI(c)—XVI(c) of FIG. 15, respectively in the fifth embodiment.
Figure 16B:
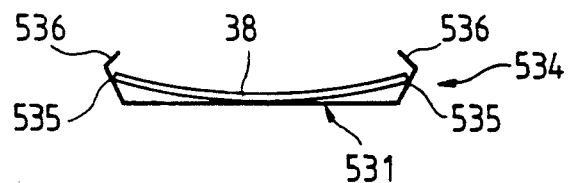
Figure 16C:
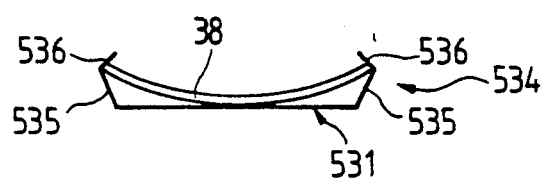

More specifically, as shown in FIG. 16(a), a distance between the opposing guide plates 534 is greater than a width of the developer sheet at the sheet feed in position, and a distance between the opposing guide plates 534 is gradually reduced, so that the distance is smaller than the width of the developer sheet as shown in FIGS. 16(b) and 16(c).

Further, as shown in FIGS. 16(a) thru 16(c), the guide plates 534 obliquely extend with respect to a vertical direction. That is, in cross-sectional visions, the guide plates 534 have oblique portions 535, so that a width of the sheet path is gradually increased in upward direction. Further, at the upper edge portions of the oblique portions, sheet edge stop portions 536 are provided. The sheet edge stop portions are also obliquely provided with respect to the vertical direction, so that a width of the sheet path is gradually decreased in upward direction.

Since the distance between the guide plates 534 is gradually reduced in the sheet travelling direction, and since the guide plates have the oblique portions 535 and the sheet edge stop portions 536, the developer sheet is arcuately bent to have an arcuate cross-section in accordance with the sheet running so that the lateral center portion is positioned lower than the lateral side edge portions thereof.

In operation, by the rotations of the feed in roller 532a and the nip rollers 532b, the developer sheet 38 is transferred and is introduced into a space defined between the guide members 534 and 534 as shown in FIG. 16(a). In this case, gaps are provided between each of the guide members 534 and the each of the side edges of the sheet 38. When the sheet 38 reaches the slanting portions 534a, side edges of the sheet 38 are floated upwardly because of the guide of the oblique portions 535 as shown in FIG. 16(b). On the other hand, further elevation of the side edge portions of the sheet 38 is prevented by the sheet edge stop portions 536. In this case, the sheet 38 is arcuately bent in such a manner that the lateral central portion of the sheet 38 is positioned lower than the side edge portions thereof. With such sheet benting mode, the sheet 38 is introduced into the cover member 123 through the sheet inlet 133a.

During the sheet travel through the cover member 1243, the developer sheet 38 is heated by the hot air stream, so that the surface resin layer and the developer material are melted, and then solidified, to thus complete image fixing. In this solidifying phase, the developer sheet may be urged to be bent toward the imaging surface. However, since the developer sheet 38 is positively arcuately bent, such disadvantageous curling can be prevented. Accordingly, the sheet jamming at the sheet outlet 133b is avoidable, so that the sheet 38 is smoothly delivered to the feed out roller 533a and the nip roller 533b.

Further, during melting state of the surface resin layer and the developer material, only the sheet edge portions are in contact with the guide members 534. Therefore, there is no direct contact between the output imaging surface and the any mechanical components in the fixing unit. As a result, resultant output image provides high quality. Furthermore, the hot air can be applied to the arcuate surfaces of the developer sheet 38. Therefore, hot air can be uniformly applied over the output imaging surface, to thereby avoid fixing irregularities. Further, more, the lateral center portion of the sheet 38 is positioned lower than the side edge portions thereof, the sheet is not abruptly urged toward the cross-flow fan, which urging force may be caused by the hot air recirculation directing toward the fan (upwardly directing arrow in FIG. 14).

Seveal modifications may be available in the fifth embodiment. For example, the lateral center portion of the developer sheet can be positioned higher than the side edge portions thereof for arcuate bending to the sheet. Further, the guide members 534 are provided separate from the guide plate 531 instead of the integral arrangement. Furthermore, transferring belt may be available instead of the feed in feed out rollers and nip rollers. Moreover, radiant heating is available instead of the convection heating, and numbers of the heat generating element can be increased.

A sixth embodiment will next be described with reference to FIGS. 17 and 18. The sixth embodiment concerns an improvement on a cover member which is provided over the sheet guide plate 331.

In the foregoing embodiment, the cover member is formed of a thermally conductive member such as a single iron plate. Therefore, heat within the cover member may be externally radiated. In this connection, the sixth embodiment is contemplated for efficiently utilizing the heat within the cover member.

A thermal fixing unit 623 in the sixth embodiment includes a cross-flow fan 134, a heat generating element such as Nichrome wire 139, sheet feed in rollers 332 and sheet feed out rollers 333. These elements are the same as those in the foregoing embodiments, and therefore, further explanation can be neglected.

Figure 17:
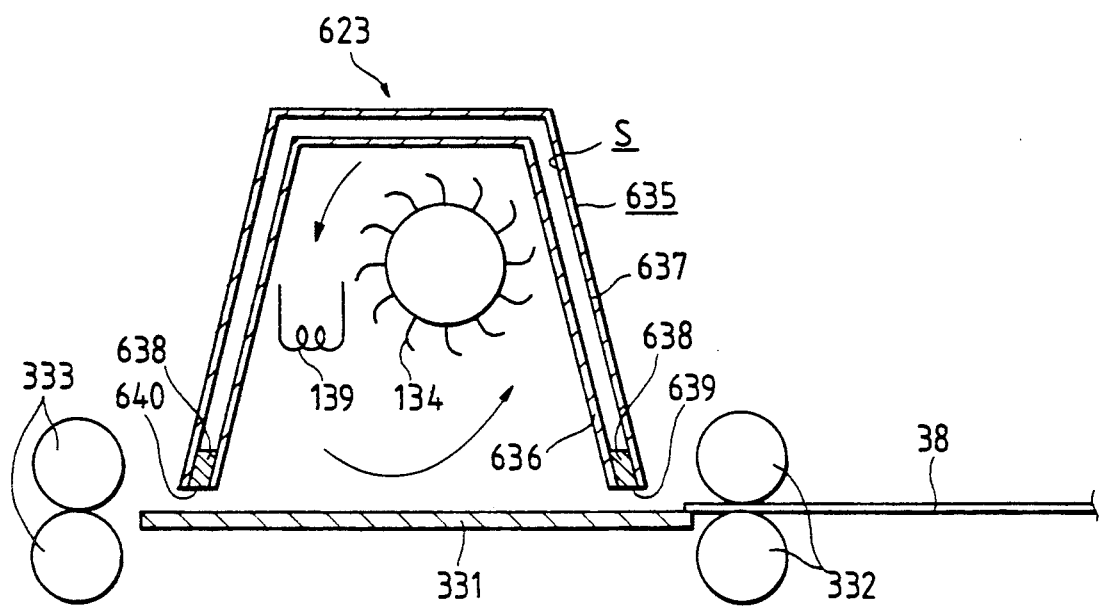
FIG. 17 is a cross-sectional view showing a thermal fixing unit or a heating unit according to a sixth embodiment of this invention.
Figure 18:
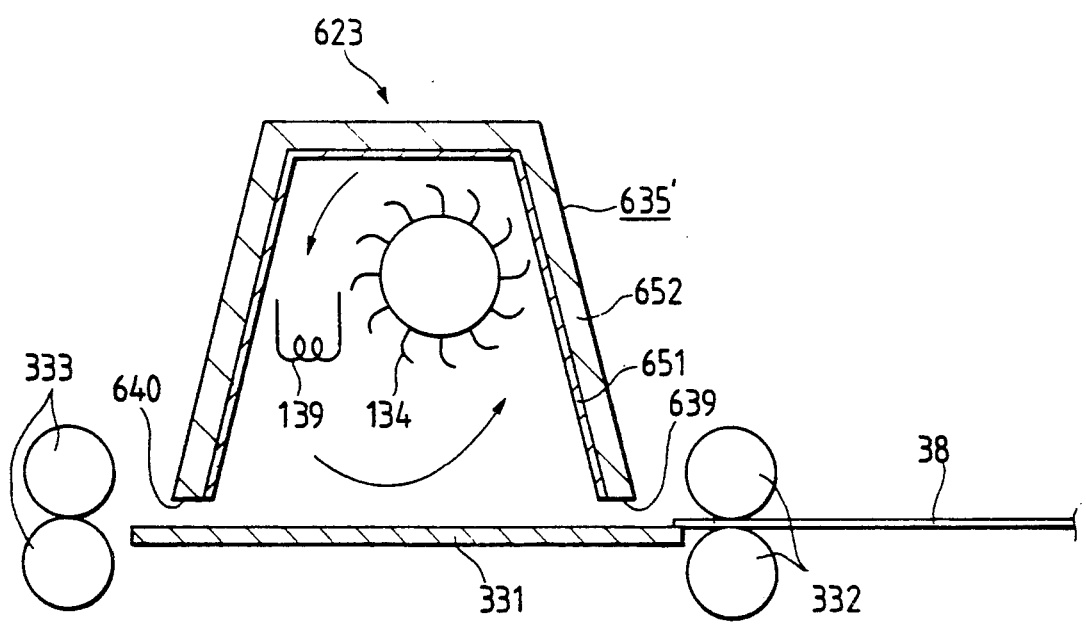
FIG. 18 is a cross-sectional view showing a thermal fixing unit in which a modification is effected to the sixth embodiment.

As shown in FIG. 17, the thermal fixing unit 623 also includes a sheet guide plate 331 formed of an iron plate and a cover member 635 disposed over the sheet guide plate 331. The cover member 635 is in a form of a heat insulative arrangement in which an outer wall portion 637 and an inner wall portion 636, those being formed of metal, are provided spaced away from each other. Seal members 638 are provided at end portions of the walls and between the walls, so that a vacuum layer S is sealingly provided. Further, sheet inlet and outlet portions 639 and 640 are provided at lower end portions of the heat insulative cover member 635.

The developer sheet 38 delivered into the thermal fixing unit 623 by the feed in rollers 332 is heated by the hot air generated and flowed by the heat generating element 139 and the cross-flow fan 134. In this heating process, since the vacuum layer S is provided by the dual wall structures 637 and 636, heat insulating function is obtainable. Therefore, interior space defined by the cover member 635 is thermally insulated from the outside, and accordingly, heat generated by the heat generating element 139 can be efficiently utilized. Even if any components or unit are disposed around the cover member 536, such ambient components or unit can be protected from accidental heating.

Several modifications may be applied to the sixth embodiment. For example, air layer can be provided instead of the vacuum layer at the space S. Alternatively, as shown in FIG. 18, the inner and outer walls are in direct contact with each other. The inner wall 651 is formed of a metallic plate, and the outer wall 652 is formed of an adiabatic material such as a glass wool. In the latter structure, the cover member 635' can be provided at low cost. Furthermore, the guide plate 331 can be formed of dual walls so as to provide the adiabatic characteristic similar to the adiabatic cover member 635 or 635'.

A seventh embodiment of this invention will be described with reference to FIGS. 19 thru 22. The seventh embodiment concerns an improvement on sheet inlet and outlet portions. In the foregoing embodiment, the sheet inlet and outlet portions are normally opened, so that hot air flowed in the cover member may be leaked through the inlet and outlet portions. Accordingly, heat loss may occur to render the heating or thermal fixing process prolonged. Further, the heater must provide large capacity. As a result, overall device becomes costly, and ambient components may be heated by the hot air passing through the open sheet inlet and outlet.

In the seventh embodiment, such disadvantageous hot air leakage is avoided by providing shutter means disposed at the sheet inlet and outlet for selectively closing the inlet and outlet, and means for driving the shutter means.

In the seventh embodiment, similar to the foregoing embodiments, a thermal fixing unit 723 includes a cross-flow fan 739, a heat generating element 738, a cover member 733, a sheet guide plate 731, sheet feed in rollers 736 and sheet feed out rollers 737. At side edge portions of the sheet guide plate 731, side walls 732 are provided which extend along the developer sheet travelling direction. Between the opposing side walls 732, the cover member 733 is provided. The cover member 733, the side walls 732 and the sheet guide plate 731 function as a covering means 730 in combination. Further, between the sheet guide plate 731 and lower edges of the cover member 733, sheet inlet 734 and the sheet outlet 735 are provided.

A pair of shutter members 740 and 741 are provided which selectively close the sheet inlet 734 and sheet outlet 735. Each of the shutter members 740 and 741 extends between the confronting side walls 732 and 732 (only one of the side walls is shown in FIGS. 19-22), and shutter drive means such as electromagnetic solenoids 742 and 743 are connected to the respective shutter members 740 and 741. In response to the actuation of the electromagnetic solenoids 742 and 743, the shutter members 740 and 741 are vertically movable between a closing position indicated by a solid line in FIG. 19 and an open position indicated by a two dotted chain line in FIG. 19. Furthermore, in the vicinity of the feed in rollers 736, a sheet detector or sensor 744 is provided which detects a leading edge or tail edge of the developer sheet 38 travelled over the guide plate 731.

Figure 19:
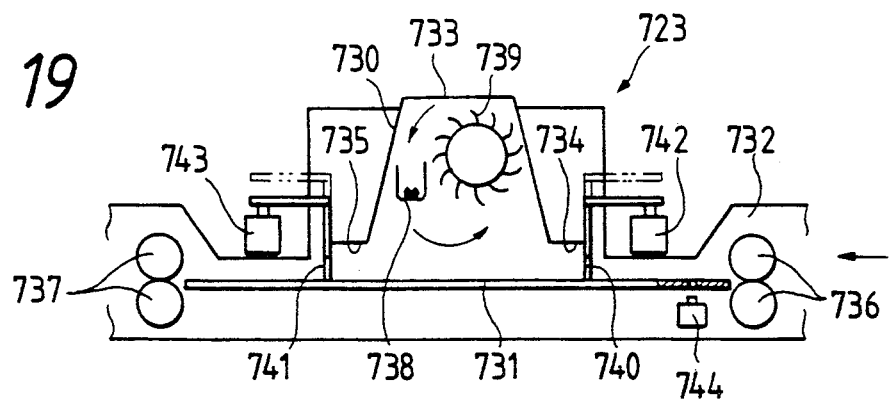
FIGS. 19 thru 22 are schematic illustrations showing a thermal fixing unit or a heating unit and showing various operational phases according to a seventh embodiment of this invention.

In operation, prior to the sheet delivery into the thermal fixing unit 723, both shutter means 742 and 743 close the sheet inlet 734 and 735, respectively, by the actuation of the electromagnetic solenoids 742 and 743 as shown by the solid line in FIG. 19. Further, in this case, an electrical current is applied to the Nichrome wire 738, and the cross-flow fan 739 is operated, so that a hot air is circulated within an internal space of the covering means 730.

Figure 20:
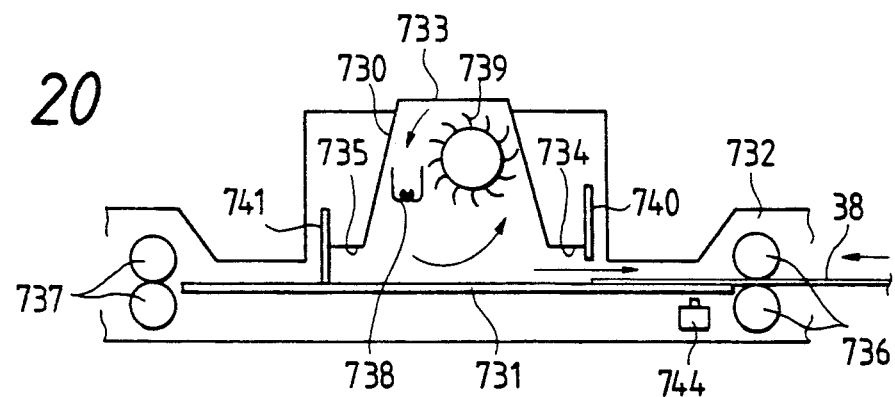

During travel of the developer sheet 38 toward the covering means 730 by the rotation of the feed in rollers 736, the leading edge of the sheet 38 is detected by the sheet edge detector 744. After detection and after predetermined sheet travel, the leading edge of the sheet is brought into a position close to the inlet side shutter 740. In this instance, the inlet side electromagnetic solenoid 742 is actuated to open the inlet side shutter 740 so as to allow the sheet 38 to pass through the sheet inlet 734 as shown in FIG. 20. Therefore, the developer sheet 38 can be entered into the covering means 730.

Figure 21:
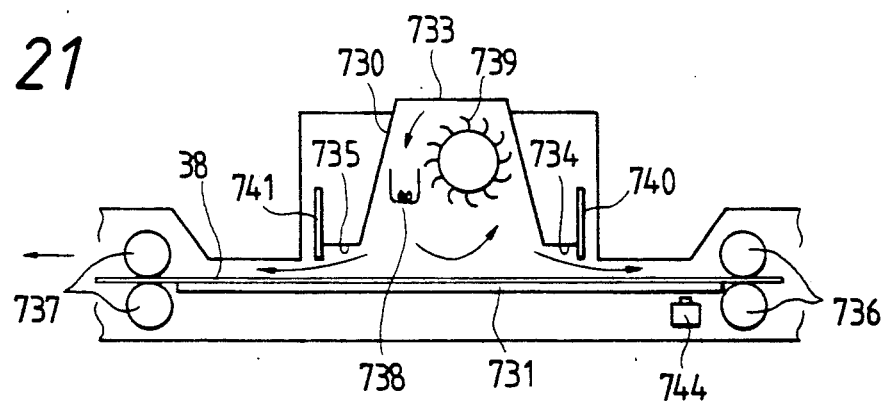

After opening the inlet side shutter 740, the developer sheet 38 is further moved by a predetermined distance. When the leading edge of the sheet 38 is brought into a position close to the outlet side shutter member 741, the shutter 741 is opened by the actuation of the outlet side electromagnetic solenoid 743 as shown in FIG. 21, so that the sheet outlet 735 is opened. As a result, the developer sheet 38 can pass through the sheet outlet 735 and can be discharged from the covering means 730.

Figure 22:
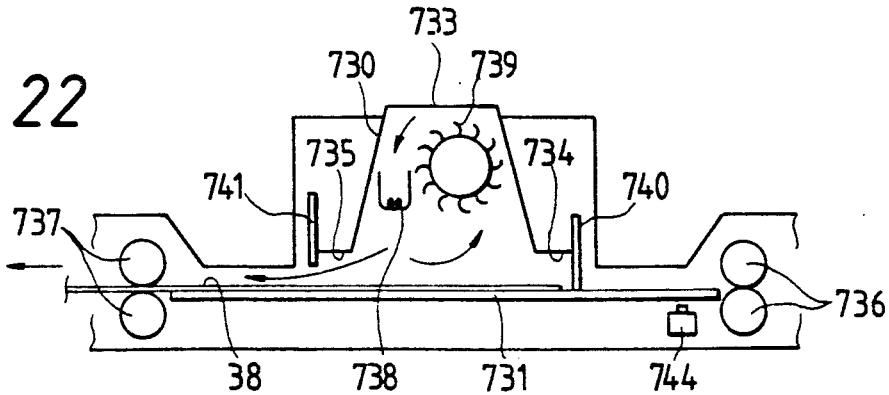

After detection of the tail edge of the developer sheet 38 by the sheet detector 744, the sheet is travelled by a predetermined distance. When the tail edge of the sheet 38 passes over the sheet inlet 734 and exceeds the inlet side shutter member 740, the inlet side shutter member 740 is moved toward its close position by the inlet side electromagnetic solenoid 742, to thereby close the sheet inlet 734 as shown in FIG. 22. Thereafter, when the sheet 38 passes over the sheet outlet 735 and exceeds the outlet side shutter member 741, the shutter member 741 is closed by the outlet side electromagnetic solenoid 743. As a result, the sheet outlet 735 is closed. Incidentally, the shutter members 740 and 741 are closed or opened after a predetermined time interval corresponding to the sheet transferring distance counting from the detection timing of the leading edge and tail edge of the developer sheet 38 by the sheet detector 744.

During travel of the developer sheet 38 through the covering means 730, the sheet 38 is subjected to heating for effecting thermal fixing to the output image. In the seventh embodiment, the shutter members 740 and 741 are only opened when the developer sheet 38 passes through the sheet inlet 734 or the sheet outlet 735. Accordingly, hot air leakage therethrough can be restrained at minimum level. Therefore, heat loss can be reduced, and effective heating to the developer sheet is achievable. Further, overheating to the ambient component can be avoided, and furthermore, a Nichrome wire which provides a small heat generation amount is also available, to thereby reduce production and running cost.

The shutter members can be driven by cam means driven by a motor, or can be pneumatically or hydraulically operated. As a base substrate of the sheet, a transparent plastic film feasible for an overhead projector can be employed. Further, it goes without saying that the embodiment is available for a monochromatic copying machine similar to the foregoing embodiments.

Figure 23:
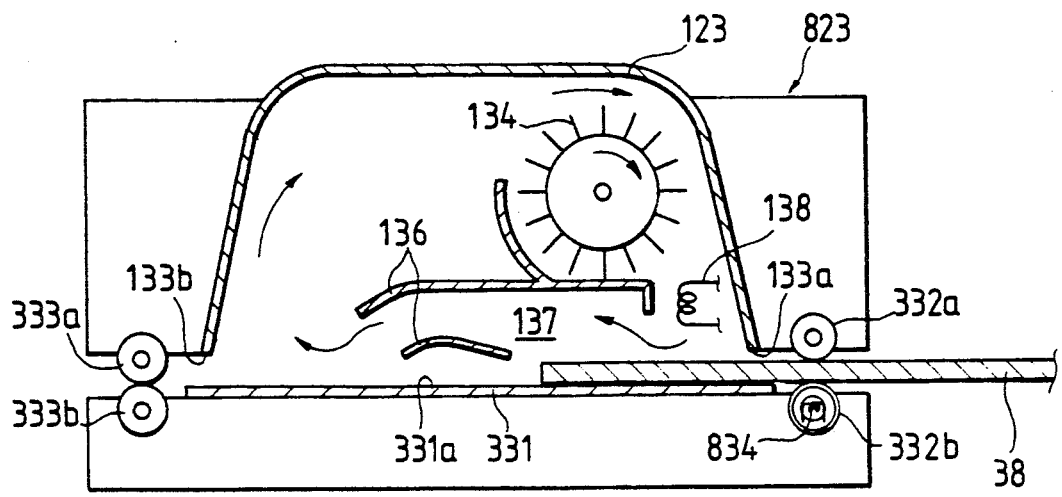
FIG. 23 is a cross-sectional view showing a thermal fixing unit or a heating unit according to an eighth embodiment of this invention.

A eighth embodiment will be described with reference to FIGS. 23 and 24. The eighth embodiment concerns fine temperature control to the heating means for heating the developer sheet at a thermal fixing unit or heating unit 823 taking the developer sheet characteristic into consideration.

As described above, the developer sheet for color copying has the base substrate, the developer material layer and the surface resin layer. The base substrate is formed of a paper or PET. In case of the developer sheet having the paper substrate, the substrate has small thermal capacity and the thermal fixing is required for the purpose of coloring acceleration and surface glossing. Therefore, heating to the sheet is only required for melting at least an exact surface of the surface resin layer. On the other hand, in case of the developer sheet having the PET substrate, the substrate has large thermal capacity, and the thermal fixing is required for the purpose of coloring acceleration and for complete melting of the developer material and the surface resin layer. Therefore, heating to the sheet is required for melting entire resinous material in order to obtain high transparency capable of being used as an overhead projector sheet. Further, the adhering characteristic of the developer material to the base substrate is dependent on the kind of the base substrate. Therefore, compositions of the developer material is also dependent on the kinds of the base substrate in light of the adhesivity of the developer material with respect to the substrate.

With the above in view, heat amount required in the developer sheet having the paper substrate would be largely different from the heating amount required in the developer sheet having the PET substrate. For example, the latter sheet requires the heating amount three times as large as that required in the paper substrate developer sheet.

In the eighth embodiment, the heating amount is changeable in accordance with the kind of the developer sheet by selectively operating a plurality of heat generating elements so as to control heating amount without lowering the thermal fixing operation. More specifically, if such control is not carried out, in case of the PET substrate developer sheet, sheet travelling speed must be reduced in order to apply sufficient heat thereto. As a result, prolonged thermal fixing operation must be required.

The thermal fixing unit or the heating unit 823 in the eighth embodiment includes a cover member 123 defining a sheet inlet 133a and a sheet outlet 133b and a sheet guide plate 331 formed of iron and having a sheet guide surface 331a. Within the cover member 123, provided are a cross flow fan 134, a heat generating element 138 and an air guide plate 136 defining a hot air passage 137. Further, sheet feed in rollers 332a 332b and sheet feed out rollers 333a 333b are provided for feeding the developer sheet 38. Such structure is similar to the foregoing embodiments, and therefore, further description can be neglected.

The lower feed in roller 332b is in contact with the base substrate surface, and an additional coil heater 734 is provided within the feed in roller 332b. The lower feed in roller 332b is formed of thermally conductive material such as iron. The coil heater 834 and the iron roller 332b serve as a first heating means for heating the base substrate of the developer sheet 38 to thereby accelerate coloring of the developer material. Incidentally the heat generating element 138 and the cross flow fan 134 can be referred to as a second heating means.

Further, a sheet kind identification means 820 is provided at a position corresponding to the identification means 50 in FIG. 1. In the eighth embodiment, a projection 32a is provided at the developer sheet cassette 32. The shape of the projection 32a is indicative of the kinds of the developer sheet 38, so that the sheet kind identification means 820 can identify the shape of the projection 32a to thereby identify the sheet kind. Upon detection of the sheet kind by the identification means 820, it generates and sends drive signal to at least one of the heaters 138 and 834.

Figure 24:
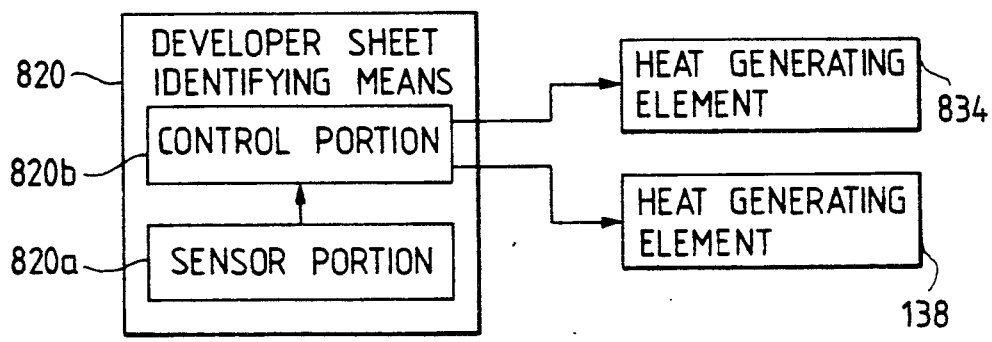
FIG. 24 is a block diagram showing an electrical connection of a sheet identification means in the eighth embodiment.

In FIG. 24, the sheet kind identification means 820 includes a photoelectric sensor portion 820a for detecting the shape of the projection 32a of the cassette 32, and a control portion 820b for judging the sheet kind in response to the detection signal from the sensor portion 820a. To be more specific, the control portion 820b judges whether the developer sheet includes the paper substrate or the PET substrate. In case of the paper base substrate, the controller 820b sends a drive signal to the heater 138 for its heat generation, and in case of the PET substrate, the controller 820 sends a drive signal to both the heater 138 and the coil heater 834.

With the structure thus organized, when the developer sheet 38 having the paper substrate is employed, the sheet 38 is heated only by the hot air flow generated by the second heating means. On the other hand, when the developer sheet 38 having the PET substrate is employed, the substrate side of the sheet is firstly heated by the first heating means (coil heater 834 and the iron roller 332b) for coloring promotion during sheet feed in operation, and then the sheet 38 is sufficiently heated by the hot air stream within the cover member 123 for fixing image provided with high gloss and sufficient transparency.

In the eighth embodiment, since the second heating means is operated or first and second heating means are operated in response to the signal from the sheet kind identification means 820 in accordance with the sheet kind, heating to the PET substrate developer sheet can be sufficiently carried out within a shortened period.

Several modifications may be conceivable in the eighth embodiment. For example, instead of the heat roller 332b of the first heating means, a panel heater can be provided which is in contact with the upper feed in roller 332a. Further, similar to the second embodiment, a plurality of heat generating elements can be provided within the cover member 123 so as to constitute the second heating means. Furthermore, in the eighth embodiment, the sheet kind identification means 820 is provided at a position adjacent the developer sheet cassette 32. However, for the sheet kind detection, a light transmissive type substrate detection sensor may be provided at a developer sheet path and at a position adjacent the feed in rollers 332a and 332b. Such detection sensor can detect the sheet kind by detecting the light transmissive factor of the sheet. Moreover, instead of such identification means or detection means, a PET mode switch may be provided at an external side of the main frame so as to selectively operate the first and second heating means.

Figure 25:
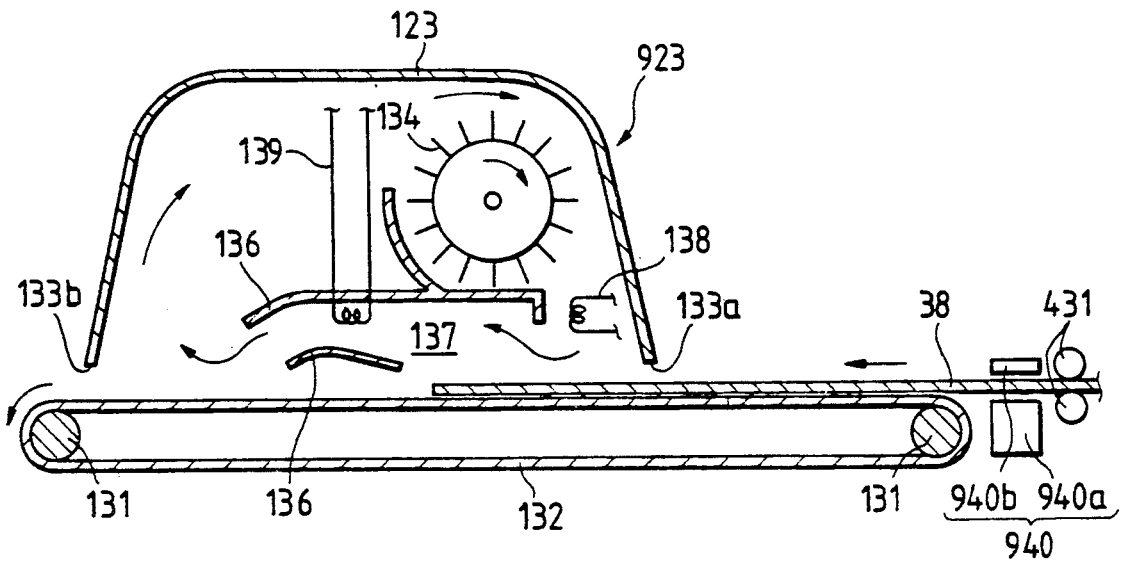
FIg. 25 is a cross-sectional view showing a thermal fixing unit or a heating unit according to a ninth embodiment of this invention.

A ninth embodiment of this invention will be described with reference to FIGS. 25 and 26. The ninth embodiment is similar to the eighth embodiment in terms of control to heating to the developer sheet 38. More specifically, in the eighth embodiment, the heat control is made by selectively operating the first and second heating means so as to vary heat amount in accordance with the sheet kind. On the other hand, in the ninth embodiment, the heat control is made by changing transfer speed of the developer sheet 38 so as to vary heat exposure period in accordance with the sheet kind.

As described above, the PET substrate developer sheet requires great heating amount in comparison with the paper substrate developer sheet. In this connection, developer sheet travelling speed must be lowered so as to apply sufficient heat to the PET substrate sheet. Accordingly, heating process requires prolonged time. On the other hand, if the heating period is predominantly determined, sufficient heating to the PET substrate developer sheet may not be attainable in order to obtain high transparency. Therefore, in the ninth embodiment, the kind of the developer sheet is detected, and the sheet transferring speed is changeable in accordance with the detected sheet kind.

Similar to the first embodiment, the image recording apparatus includes a sheet identification means 50 for detecting a sheet size. The developer sheets are stacked in a developer sheet cassette 32 which is provided with a projection 32a which is indicative of the sheet size. The identification means 50 detects the shape of the projection 32a, so that the sheet size can be identified.

A thermal fixing unit or a heating unit 923 in the ninth embodiment includes components the same as those of the foregoing embodiments. In FIGS. 25 and 26, like parts and components are designated by the same reference numerals and characters as those shown in the foregoing embodiments. Therefore, further description can be omitted for avoiding duplicating description.

Figure 26:
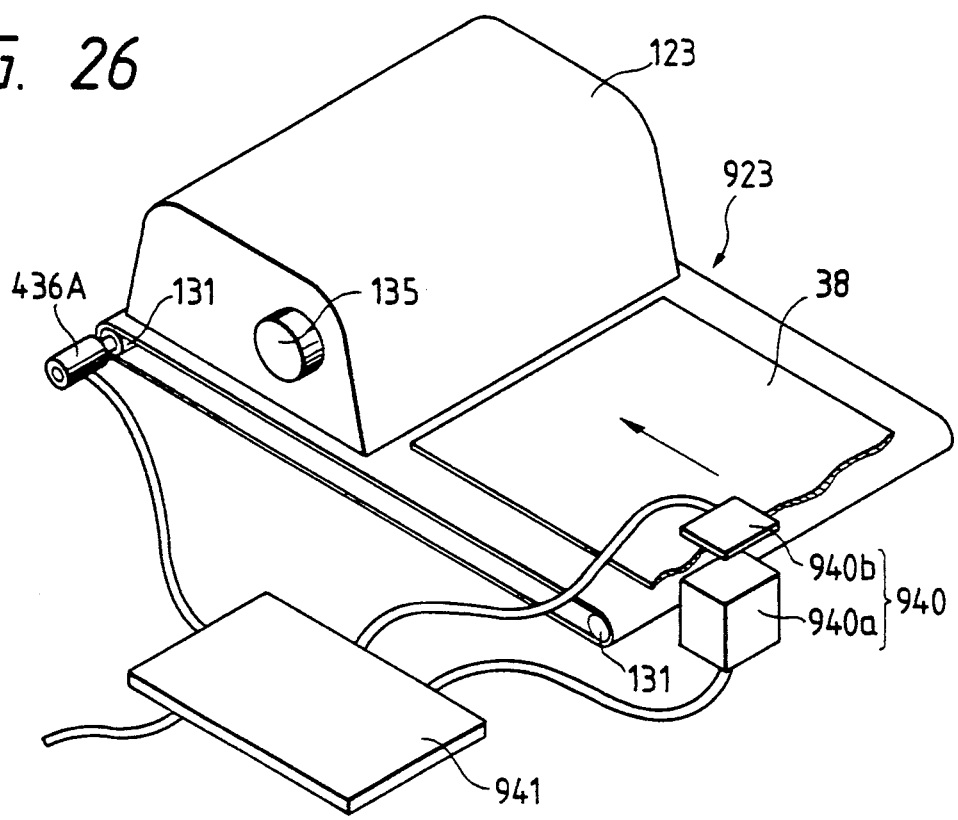
FIG. 26 is a perspective view showing the thermal fixing unit in the ninth embodiment.

As shown in FIG. 26, one of the rollers 131 is connected to a variable speed motor 436A. At an upstream side of the metallic endless belt 132, a pair of feed rollers 431 are provided. Further, a light transmissive type sensor 940 is provided at a position between the feed rollers 431 and the endless belt 132 for detecting the kinds of the substrate of the developer sheet 38. The detector 940 includes a light emitter 940a and a light receiver 940b for detecting the substrate kinds in accordance with the light transmission rate. This detector 940 is connected to a control panel 941 so as to send a detection signal thereto. In the ninth embodiment, the substrate kind sensor 940 is spaced away from the sheet inlet 133a by about 80 mm.

The control panel 941 is connected to the variable speed motor 436A for controlling the rotation speed thereof in response to the detection signal indicative of the sheet kind. For example, if low light transmission rate is detected by the sensor 940, the developer sheet 38 is regarded as having the paper substrate provided with a low thermal capacity. Therefore, the control panel 941 sends a drive signal to the variable speed motor 436A, so that it is rotated at high speed, whereby the sheet transfer belt 132 is moved at a speed of 42 mm/sec. At the same time, electrical current is applied to the heat generating elements 138 and 139, and the drive motor 135 is energized for generating hot air stream within the cover member 123. Therefore, the space within the cover member 123 is preheated. Since the distance between the sensor 940 and the sheet inlet 133a is about 80 mm, and since the transfer belt 132 is moved at the speed of 42 mm/sec., the developer sheet 38 is introduced into the cover member 123 in about 2 seconds.

If high light transmission rate is detected by the sensor 940, the developer sheet 38 is regarded as having the PET substrate provided with a high thermal capacity. Therefore, the control panel 941 sends a drive signal to the variable speed motor 436A, so that it is rotated at low speed, whereby the sheet transfer belt 132 is moved at a speed of 14 mm/sec. In this case the electrical current is applied to the heat generating elements. However, since the moving speed of the sheet transfer belt 132 is lower than that of the case where the paper substrate is detected, it takes much time until the developer sheet is introduced into the cover member 123. Therefore, sufficient preheating is effected within the cover member 123 for applying sufficient heat to the PET base developer sheet 38. Further, since the moving speed of the transfer belt 132 is relatively lower than the case where the paper base developer sheet is travelled, the PET base developer sheet undergoes sufficient heating, so that the resinous material can be sufficiently melted for the enhancement of transparency.

In view of the above, in the ninth embodiment, if the paper base developer sheet 38 is used, high speed heating thereto is achievable by increasing the transferring speed of the transfer belt 132. Accordingly, high throughput would be attainable. On the other hand, if the PET base developer sheet 38 is used, sufficient heating is achievable by lowering the transferring speed of the belt 132, to thereby obtain high transparency.

Similar to the foregoing embodiments, in the ninth embodiment, since the hot air stream is generated within the cover member 123, the developer sheet is urged to be pressed by the air stream. Therefore, no sheet jamming occur at the sheet inlet and the sheet outlet due to disadvantageous sheet curling. Further, several modifications may be made in the ninth embodiment. For example, numbers of the heat generating elements can be increased or decreased. Furthermore, sheet feed out rollers can be provided at a position adjacent the sheet outlet 133b. Moreover, similar to the foregoing embodiments, external PET mode switch can be provided instead of the control panel 941 and the sheet kind sensor 940 for setting PET base developer sheet mode or releasing the mode.

A tenth embodiment will be described with reference to FIGS. 27 thru 30. This embodiment contemplates electrical power saving in terms of heating at a thermal fixing unit or heating unit 51 and elimination of overheating of the unit.

Heater element(s) is determined so as to have an optimum thermal capacity with respect to the thermal fixing to the applied developer sheet. However, if the developer sheets are intermittently delivered to the thermal fixing unit at a prolonged timed interval, electrical power is disadvantageously consumed during the period at which no developer sheet is at the thermal fixing unit. In this case, the thermal fixing unit per se may be overheated. Therefore, in the tenth embodiment, heater output or relative travelling speed of the developer sheet is controlled for saving the electrical power and for avoiding overheating to the unit during non service period thereof.

Figure 27:
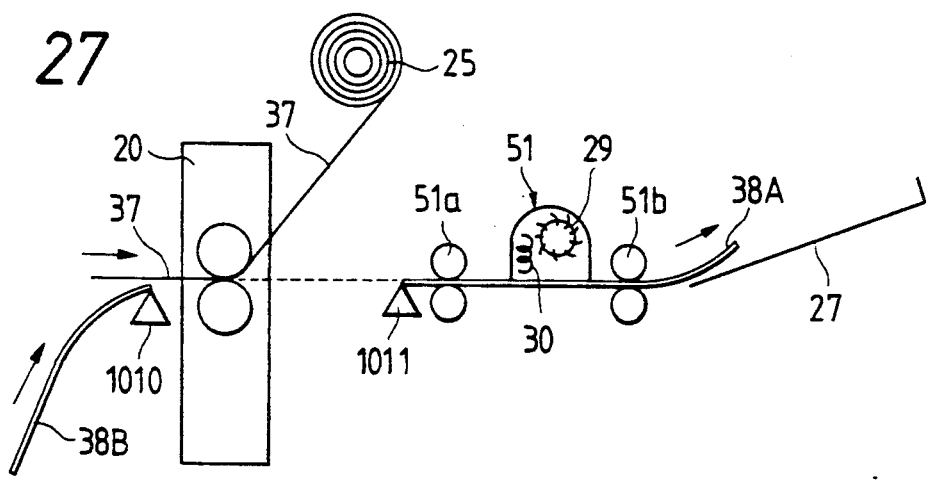
FIG. 27 is a schematic illustration showing a general operation of the image recording apparatus and a thermal fixing unit according to a tenth embodiment of this invention.
Figure 28:
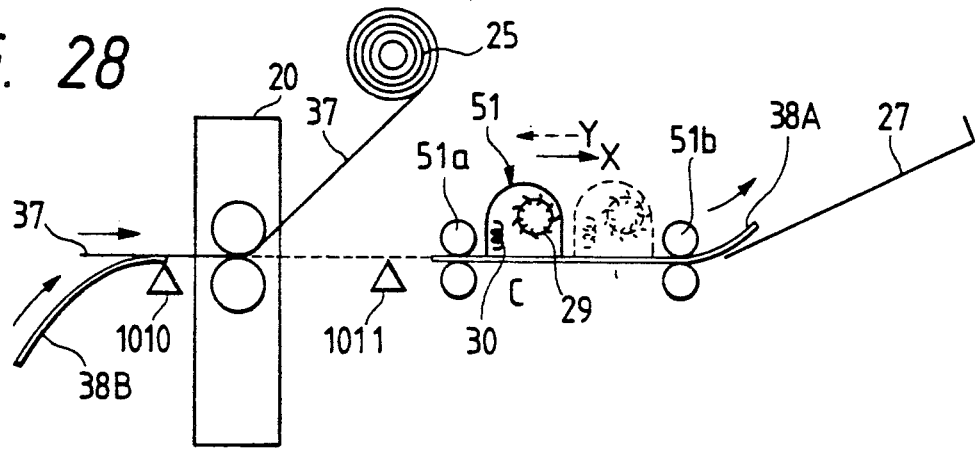
FIG. 28 is a schematic illustration in which a modification is effected on the tenth embodiment.

FIG. 27 shows a schematic illustration of an image recording apparatus wherein like parts and components are designated by the same reference numerals and characters as those shown in FIG. 1. In other words, the schematic illustration is directly applicable to the image recording apparatus shown in FIG. 1.

Feed in and feed out rollers 51a and 51b are rotated at peripheral speed equal to the pressure developing speed at the pressure developing unit 20. This speed is referred to as "A speed". The hot air generated by the heat generating element 30 and blown by the fan 29 of the thermal fixing unit 51 is controlled to have a constant temperature taking the A speed into consideration.

After pressure developing operation to a first developer sheet 38A, the first sheet 38A is delivered to the thermal fixing unit 51 by the feed in rollers 51a. At an inlet portion of the thermal fixing unit 51, a developer sheet sensor 1011 is provided so as to detect the sheet supply to the unit 51. On the other hand, at an inlet portion of the pressure developing unit 20, a second developer sheet sensor 1010 is provided. A distance between the first and second sensors 1011 and 1010 is slightly smaller than double longitudinal lengths of the developer sheet.

In case where the second developer sheet 38B is detected by the second sensor 1010 at the time of the detection of the first developer sheet 38A by the first sensor 1011 (that is, the pressure developing operation is continuously carried out with respect to successive developer sheets), the first developer sheet 38A is subjected to thermal fixing operation at the A speed. In this case, the temperature of the hot air within the unit 51 is controlled to be high corresponding to the A speed.

On the other hand, in case where the second developer sheet 38B is not detected by the second sensor 1010 at the time of the detection of the first developer sheet 38A by the first sensor 101 (that is, pressure developling operation is intermittently carried out by a long timed interval), rotation speeds of the feed in and feed out rollers 51a and 51b are decreased, so that resultant sheet delivering speed is lower than the A speed. This resultant speed can be referred to as "B speed". At the same time, the hot air temperature within the thermal fixing unit 51 can also be lowered, since the sheet 38A is transferred in the unit 51 at the low speed (B speed). As a result, electrical power consumption attendant to the heater 30 can be reduced. In other words, thermal fixing operation can be performed at low speed during the spare time at which no successive developer sheet is entered into the pressure developing unit 20. After the thermal fixing, the first developer sheet 38A is discharged toward the sheet tray 27 by way of the feed out rollers 51b.

Several modification may be conceivable in the tenth embodiment. In the tenth embodiment, rotation speeds of the feed in and feed out rollers 51a and 51b are lowered so as to decrease the sheet transferring speed from A speed to B speed. On the other hand, in one modification shown in FIG. 28, the sheet travelling speed (A speed) is maintained. However, the entire thermal fixing unit 51 including an outer cover, the fan 29 and the heater 30 is provided movable in a sheet running direction X and a direction Y opposite the X direction. Because of the movement of the thermal fixing unit 51, relative transferring speed of the developer sheet is changeable. For example, if the thermal fixing unit 51 is moved at (A−B) speed in the X direction, the transferring speed of the developer sheet 38A relative to the thermal fixing unit 51 is lowered to B speed. In this modification, a scan back means (not shown) is provided so as to promptly move the unit 51 to its original position C (in Y direction) upon completion of the thermal fixing operation with respect to the first developer sheet 38A in order to initiate the subsequent thermal fixing operation with respect to the second sheet 38B.

Figure 29:
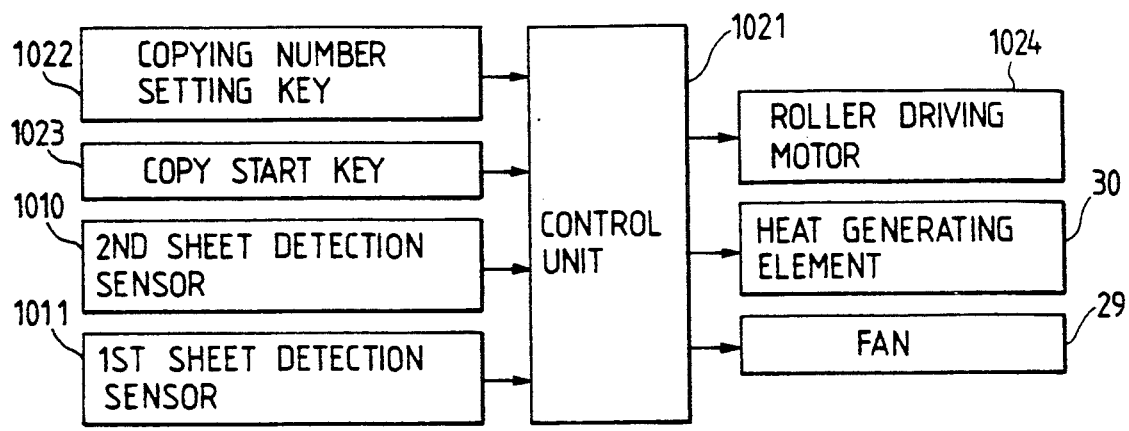
FIG. 29 is a block diagram showing a controlling portion in the tenth embodiment.

A control unit in the tenth embodiment is shown in FIG. 29. A control unit 1021 is constituted by a microcomputer. A copying number setting key 1022, a copy start key 1023 and the first and second sheet sensors 1011 and 1010 are connected to the control unit 1021 so that signals indicative of the copying number, copy start and sheet detections are transmitted to the control unit 1021. Further, a drive motor 1024 for driving the feed in feed out rollers 51a 51b, the heat generating element 30 and the fan 29 are connected to the control unit 1021. These components are driven in accordance with a predetermined program by output signals generated from the control unit 1021 in response to the signals from the keys or sensors.

Figure 30:
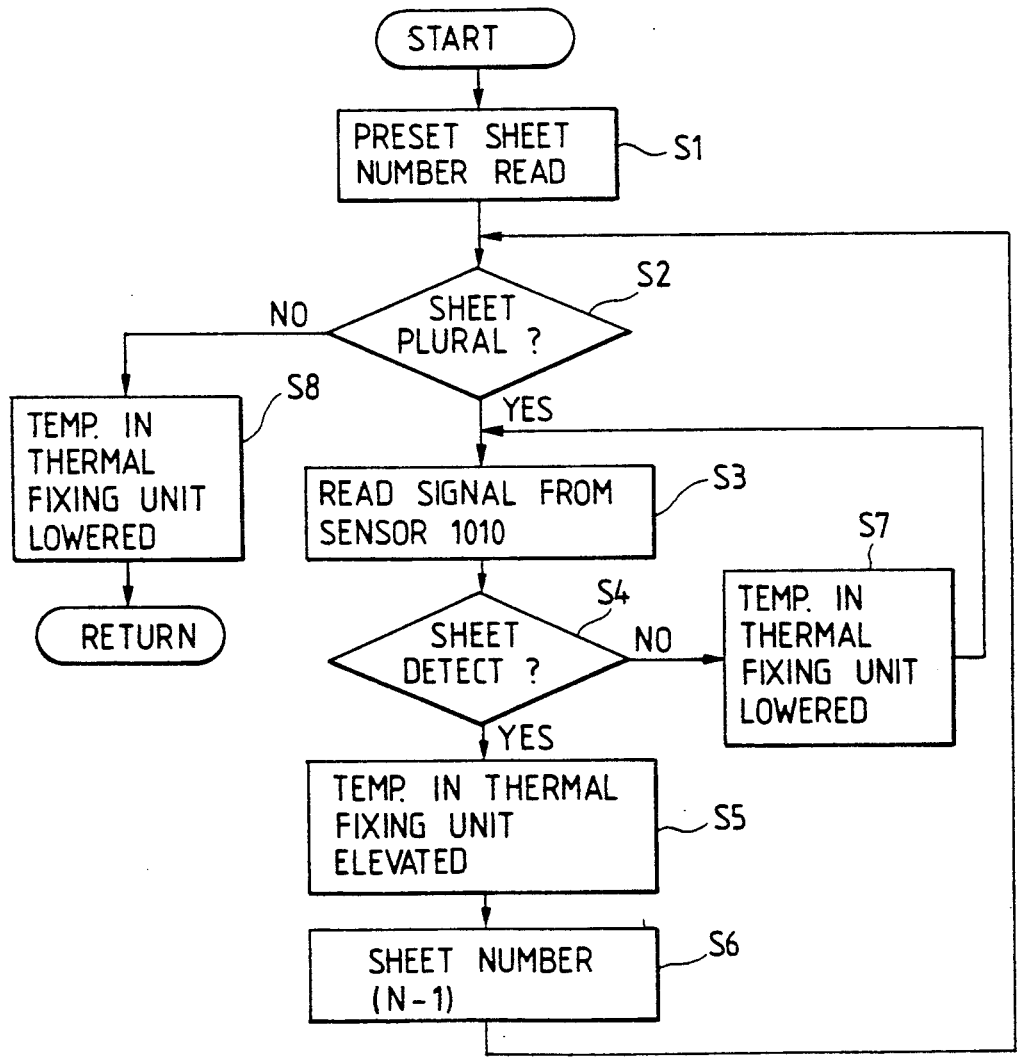
FIG. 30 is a flow chart for showing operation of the controlling portion in the tenth embodiment.

Next, a controlling mode of the heater 30 will be described under the control of the control unit 1021 with reference to a flow chart shown in FIG. 30.

In step S1, upon inputting the copy start signal into the control unit 1021 from the copy start key 1023, a copying operation is initiated and, the control unit 1021 reads the copying number setted by the copying number setting key 1022. In step S2, it is checked whether the copying number is a plural or not. If only a single sheet is to be copied, preset temperature of the heater 30 is lowered in step S8. If a plurality of the sheets are to be copied (continuous copying), the sheet detection signal from the second sensor 1010 is read in step S3. If no sheet is detected by the second sensor 1010 in step S4, temperature of the heater 30 is lowered at step S7, and a routine returns to the step S3. On the other hand, if the developer sheet is detected in step at the step S4, heating temperature at the thermal fixing unit 51 is elevated in step S5, and sheet number N is newly set by subtracting one number (N−1), and the routine returns to the step S2. Thereafter, similar routines are repeatedly carried out. Incidentally, rotation speed of the roller driving motor 1024 is changed in response to the variation of the heater temperature.

Therefore, in the tenth embodiment, if the developer sheets are continuously delivered into the thermal fixing unit 51, the temperature of the heater element 30 is maintained at high temperature while increasing the sheet transferring speed. On the other hand, if only the single developer sheet is delivered or if the sheets are intermittently delivered by a prolonged interval, heater temperature is maintained at low level and the sheet transferring speed is lowered. As a result, capacity of the heater and the heater output are maximumly utilized, and idle electrical power consumption can be reduced.

While the invention has been described in detail and with reference to specific embodiments thereof, it would be apparent for those skilled in the art that various changes and modifications can be made therein without departing from the spirit and scope of the invention.

What is claimed is:

1. An image recording apparatus for recording an image on an image recording medium, the image recording medium including a photosensitive pressure sensitive recording medium carrying microcapsules encapsulating therein a chromogenic material and a photosensitive material, and a developer medium carrying a developer material which is reactable with the chromogenic material for coloring, the image recording apparatus comprising:

an exposure unit at which the photosensitive pressure sensitive recording medium is exposed to light for forming a latent image thereon;

a pressure developing unit positioned downstream of the exposure unit, the exposed photosensitive pressure sensitive recording medium and the developer medium being superposed with each other and pressed by the pressure developing unit for forming an output image on the developer medium by the chromogenic reaction;

a thermal fixing unit positioned downstream of the pressure developing unit for fixing the output image on the developer medium, the thermal fixing unit being provided with a heat application means for heating the developer medium, the heat application means being positioned spaced away from the output image on the developer medium, said thermal fixing unit further comprising a sheet transfer means for transferring the developer sheet with the imaging surface confronting with the heat application means, and a cover member positioned above the sheet transferring means, a substantially closed internal space being defined by the sheet transfer means and the cover member;

a sheet kind identification means for identifying a kind of the developer medium; and a control means for controlling one of the heat application means, a light irradiation amount in the exposure unit, and a pressure at the pressure developing unit in accordance with the kind of the developer medium, wherein the heat application means comprises at least one heat generating means positioned in the internal space for generating a hot air and a hot air application means positioned in the internal space for blowing and circulating the hot air within the internal space.

2. The image recording apparatus as claimed in claim 1, wherein at least two heat generating means are provided, the heat generating means being positioned spaced away from each other and arranged in a travelling direction of the developer medium, and wherein the hot air application means comprises a blower which directs the hot air in the travelling direction of the developer medium.

3. The image recording apparatus as claimed in claim 1, wherein the heat generating means comprises a plate like heater formed with a plurality of through holes each extending in a direction perpendicular to a travelling direction of the developer medium, the plate like heater being covered by the cover member, and wherein the hot air application means directs hot air which pass through the through holes.

4. The image recording apparatus as claimed in claim 1, wherein the sheet transfer means comprises two rollers and an endless belt mounted between the two rollers, and wherein the thermal fixing unit further comprises a means for preventing a leading edge portion of the developer medium from being floated from the transfer means, the float-preventive means being provided at the endless belt and engageable with the leading edge of the developer medium.

5. The image recording apparatus as claimed in claim 1, wherein the sheet transfer means comprises feed in rollers for feeding the developer medium into the internal space, feed out rollers for discharging the developer medium from the internal space, and a guide plate positioned between the feed in rollers and the feed out rollers, the guide plate having an inlet side and an outlet side with respect to a travelling direction of the developer medium.

6. The image recording apparatus as claimed in claim 5, wherein the thermal fixing unit further comprises confronting side guide members approximately extending in a travelling direction of the developer medium and positioned at side ends of the guide plate, the developer medium being travelled on the guide plate and between the confronting side guide members, a distance between the confronting side guide members being larger than a lateral length of the developer medium at the inlet side and a distance between the confronting side guide members being smaller than the lateral length at the outlet side, whereby the developer sheet being arcuately bent in cross-section during its travel through the confronting side guide members.

7. The image recording apparatus as claimed in claim 1, wherein the cover member is provided adiabatically.

8. The image recording apparatus as claimed in claim 7, wherein the cover member comprises a first plate member and a second plate member spaced away from the first plate member, a vacuum layer being defined between the first and second plate members.

9. The image recording apparatus as claimed in claim 7, wherein the cover member comprises a first plate member and a second plate member spaced away from the first plate member, an air layer being defined between the first and second plate members.

10. The image recording apparatus as claimed in claim 7, wherein the cover member comprises a first plate member formed of a metal, and an adiabatic member formed over the first plate member.

11. The image recording apparatus as claimed in claim 1, wherein the cover member has one and another end walls, one end wall and the transfer means defining a sheet inlet therebetween through which the developer medium is introduced into the internal space, and the other end wall and the transfer means defining a sheet outlet therebetween through which the developer medium is discharged from the internal space.

12. The image recording apparatus as claimed in claim 11, wherein the thermal fixing unit further comprises:

first shutter means positioned at the sheet inlet for selectively opening the sheet inlet;

a second shutter means positioned at the sheet outlet for selectively opening the sheet outlet; and drive means for driving the first and second shutter means, the drive means moving the first and second shutter means to open the sheet inlet and outlet when a leading edge of the developer medium is brought into a position immediately upstream of the shutter means, and moving the first and second shutter means to close the sheet inlet and outlet when a tail edge of the developer medium passes over the first and second shutter means.

13. The image recording apparatus as claimed in claim 1, wherein the control means controls both the heat generating means and the hot air application means, and further controls a transfer speed of the sheet transfer means, and wherein the developer medium comprises an overhead projector sheet, the control means increasing one of the temperature of the heat generating means and an air application rate of the hot air application means when the overhead projector sheet is identified by the sheet kind identification means.

14. The image recording apparatus as claimed in claim 13, further comprising a developer sheet cassette for storing a stack of the developer mediums, the developer sheet cassette being provided with a protrusion whose shape is indicative of the kind of the developer medium, the sheet kind identification means being positioned in confrontation with the protrusion for detecting the shape thereof.

15. The image recording apparatus as claimed in claim 1, wherein the developer medium comprises a base substrate, a developer material layer and a surface resin layer, the heat application means being in configuration with the surface resin layer, and the image recording apparatus further comprising: an additional heating means disposed at the thermal fixing unit in confrontation with the base substrate; and the control means controls at least one of the heat application means and the additional heating means in accordance with the kind of the base substrate detected by the sheet kind of indentification means.

16. The image recording apparatus as claimed in claim 1, wherein the developer medium comprises a base substrate, a developer material layer and a surface resin layer, and the control means further controls a transferring speed of the sheet transfer means in accordance with the kind of the base substrate detected by the sheet kind identification means.

17. The image recording apparatus as claimed in claim 16, wherein the short kind identification means is provided at a position upstream of the thermal fixing unit.

18. The image recording apparatus as claimed in claim 1, further comprising: sensor means disposed at an upstream side of the thermal fixing unit for detecting an interval between a precedent developer medium and a subsequent developer medium; and the control means connected to the interval sensor means for controlling at least one of the heat application means and a transfer speed of the developer medium relative to the thermal fixing unit in response to a variation of the interval detected by the interval sensors means.

19. The image recording apparatus as claimed in claim 18, wherein the interval sensor means comprises a first sensor disposed at an immediately upstream side of the thermal fixing unit, and a second sensor disposed at an immediately upstream side of the pressure developing unit, the control means lowering the transfer speed of the developer medium and lowering a temperature given by the heat application means when prolonged interval is detected by the sensor means.

20. An image recording apparatus comprising:
a pressure developing unit where a cut developer medium and a photosensitive pressure sensitive recording medium carrying a latent image thereon upon light exposure are superposed with each other and pressed together for producing a visible image on the cut developer medium;
a thermal fixing unit having a heater for fixing an output image on the developer medium which is passable therethrough;
detection means for detecting an interval length between a precedent developer medium and a subsequent developer medium, the detection means being provided upstream of the thermal fixing unit; control means for controlling at least one of the heater and a transfer speed of the developer medium relative to the thermal fixing unit upon detection of the interval length, whereby energy overconsumption of the heater is avoidable.

21. An image recording apparatus for recording an image on an image recording medium, the image recording medium including a photosensitive pressure sensitive recording medium carrying microcapsules encapsulating therein a chromogenic material and a photosensitive material, and a developer medium carrying a developer material which is reactable with the chromogenic material for coloring, the image recording apparatus comprising:
an exposure unit at which the photosensitive pressure sensitive recording medium is exposed to light for forming a latent image thereon upon photo-curing the microcapsules;
a pressure developing unit positioned downstream of the exposure unit, the exposed photosensitive pressure sensitive recording medium and the developer medium being superposed with each other and pressed by the pressure developing unit for forming an output image on the developer medium by the chromogenic reaction;
a thermal fixing unit positioned downstream of the pressure developing unit for fixing the output image on the developer medium, the thermal fixing unit being provided with a heat application means for heating the developer medium, the heat application means being positioned spaced away from the output image on the developer medium and comprising:
a heat generating means for generating a hot air and a hot air recirculation means which provides a substantially closed space for confining the hot air in the space and for recirculating the hot air within the space, said thermal fixing unit further comprises a sheet transfer means having feed in rollers for feeding the developer medium into the internal space, feed out rollers for discharging the developer medium from the internal space; a guide plate positioned between the feed in rollers and the feed out rollers, the guide plate having an inlet side and an outlet side with respect to a travelling direction of the developer medium; and confronting side guide members approximately extending in a travelling direction of the developer medium and positioned at side ends of the guide plate, the developer medium being travelled on the guide plate and between the confronting side guide members, a distance between the confronting side guide members being larger than a lateral length of the developer medium at the inlet side and a distance between the confronting side guide members being smaller than the lateral length at the outlet side, whereby the developer sheet being arcuately bent in cross-section during its travel through the confronting side guide members.

22. An image recording apparatus for recording an image on an image recording medium, the image recording medium including a photosensitive pressure sensitive recording medium carrying microcapsules encapsulating therein a chromogenic material and a photosensitive material, and a material for coloring, the developer material comprising a base substrate formed of one of a paper and a transparent resin, a developer material layer formed over the substrate and a surface resin layer formed over the developer material, the image recording apparatus comprising:
- an exposure unit having a light source;
- a pressure developing unit providing a nipping pressure for pressure developing an image on the image recording medium;
- an original transfer means for transferring an original during light exposure;
- a thermal fixing unit having a heating means for heating and melting at least the surface resin layer;
- means for sending a signal indicative of a kind of the base substrate;
- means for controlling a heating condition defined by the heating means in response to the signal; and
- means for controlling a pressure level of the pressure developing unit in response to the signal, the means for controlling a heating condition providing a larger amount of heating energy to the developer medium when the signal is indicative of the resin substrate for enhancing transparency of a resultant medium as compared to an amount of heat energy provided when the signal is indicative of a paper substrate.

23. An image recording apparatus for recording an image on an image recording medium, the image recording medium including a photosensitive pressure sensitive recording medium carrying microcapsules encapsulating therein a chromogenic material and a photosensitive material, and a developer medium which is reactable with the chromogenic material for coloring, the developer medium comprising a base substrate formed of one of a paper and a transparent resin, a developer material layer formed over the substrate and a surface resin layer formed over the developer material layer, the image recording apparatus comprising:
- an exposure unit having a light source;
- a pressure developing unit providing a nipping pressure for pressure developing an image on the image recording medium;
- an original transfer means for transferring an original during light exposure;
- a thermal fixing unit having a heating means for heating and melting at least the surface resin layer, and thermal fixing unit further comprises means for confining hot air generated by the heating means and for recirculating the hot air within the thermal fixing unit;
- means for sending a signal indicative of a kind of the base substrate; and
- means for controlling an image recording condition in response to the signal, the image recording condition being at least one of a heating condition defined by the heating means, light irradiation rate provided by the light source for irradiating light to the original, moving speed of the original transfer means, and pressure level of the pressure developing unit, the controlling means providing a larger amount of heating energy to the developer medium when the signal is indicative of the resin substrate, for enhancing transparency of a resultant medium, as compared to an amount of heat energy provided when the signal is indicative of a paper substrate.

24. The image recording apparatus as claimed in claim 23, wherein the developer medium comprises an overhead projector sheet, and wherein the control means elevates a temperature of the heating means when the overhead projector sheet is detected by the detecting means.

* * * * *